US007553776B2

(12) United States Patent
Buriak et al.

(10) Patent No.: US 7,553,776 B2
(45) Date of Patent: Jun. 30, 2009

(54) PATTERNED FUNCTIONALIZED SILICON SURFACES

(75) Inventors: Jillian M. Buriak, Edmonton (CA); Patrick T. Hurley, Appleton, WI (US)

(73) Assignee: Purdue Research Foundation, West Lafayette, IN (US)

( * ) Notice: Subject to any disclaimer, the term of this patent is extended or adjusted under 35 U.S.C. 154(b) by 177 days.

(21) Appl. No.: 11/499,188

(22) Filed: Aug. 4, 2006

(65) Prior Publication Data

US 2006/0270101 A1 Nov. 30, 2006

Related U.S. Application Data

(62) Division of application No. 10/887,792, filed on Jul. 9, 2004, now Pat. No. 7,091,517.

(60) Provisional application No. 60/486,571, filed on Jul. 11, 2003.

(51) Int. Cl.
*H01L 21/31* (2006.01)

(52) U.S. Cl. ........................ 438/780; 438/765; 977/857

(58) Field of Classification Search .................. 438/99, 438/780, 765, 1; 257/642; 977/857, 877, 977/892; 205/420
See application file for complete search history.

(56) References Cited

U.S. PATENT DOCUMENTS

| | | | | |
|---|---|---|---|---|
| 5,565,529 | A | 10/1996 | Babich et al. | |
| 5,908,692 | A | 6/1999 | Hamers et al. | |
| 6,063,714 | A * | 5/2000 | Smith et al. | 438/778 |
| 6,147,159 | A | 11/2000 | Hu et al. | |
| 6,288,390 | B1 | 9/2001 | Siuzdak et al. | |
| 6,326,215 | B1 | 12/2001 | Keen | |
| 6,403,382 | B1 | 6/2002 | Zhu et al. | |
| 6,433,359 | B1 | 8/2002 | Kelley et al. | |
| 6,485,986 | B1 | 11/2002 | Buriak et al. | |
| 6,943,054 | B2 | 9/2005 | Bocian et al. | |
| 2003/0021967 | A1* | 1/2003 | Sagiv et al. | 428/209 |
| 2004/0023479 | A1 | 2/2004 | Tour et al. | |
| 2004/0183069 | A1 | 9/2004 | Afzali-Ardakani et al. | |
| 2004/0203256 | A1 | 10/2004 | Yang et al. | |
| 2005/0056828 | A1 | 3/2005 | Wada et al. | |
| 2005/0093162 | A1 | 5/2005 | Gracias | |

(Continued)

FOREIGN PATENT DOCUMENTS

WO WO 99/37409 7/1999

(Continued)

OTHER PUBLICATIONS

Robins et al., "Anodic and cathodic electrografting of alkynes on porous silicon", 1999, Chemical Communications, pp. 2479-2480.*

(Continued)

*Primary Examiner*—Alexander G Ghyka
*Assistant Examiner*—Reema Patel
(74) *Attorney, Agent, or Firm*—Barnes & Thornburg LLP

(57) ABSTRACT

The present invention provides a method for preparing a silicon substrate and a silicon substrate having a silicon surface comprising a pattern of covalently bound monolayers. Each of the monolayers comprises an alkyne, wherein at least a portion of each monolayer is no more than about 5 molecules of the alkyne wide.

6 Claims, 21 Drawing Sheets a) b) CP-AFM tip (anode) $H_2$ R' R' R' R' H H H H H H H H H H Si or Ge surface (cathode) scan direction scan direction c) 100 nm atomically flat (100) or (111) Si or Ge surface nano-lithography i) ≡—R ii) ≡—R' d) 100 nm R R R R R' R' R' R'

U.S. PATENT DOCUMENTS

| | | | |
|---|---|---|---|
| 2005/0208142 | A1 | 9/2005 | Zheng et al. |
| 2005/0227405 | A1 | 10/2005 | Sudholter et al. |
| 2005/0266697 | A1 | 12/2005 | Korgel et al. |

FOREIGN PATENT DOCUMENTS

| | | |
|---|---|---|
| WO | WO 00/26019 | 5/2000 |

OTHER PUBLICATIONS

Hurley et al., "Nanopatterning of alkynes on hydrogen-terminated silicon surfaces by scanning probe-induced cathodic electrografting", Aug. 2003, Journal of the American Chemical Society, 125, pp. 1134-11339.*

Hoeppener et al., "Constructive Microlithography: Electrochemical Printing of Monolayer Template Patterns Extends Constructive Nanolithography to the Micrometer-Millimeter Dimension Range", May 2003, Nano Letters, vol. 3 No. 6, pp. 761-767.*

Canham, L.T.:Silicon quantum wire array fabrication by electrochemical and chemical dissolution of wafers, *Appl. Phys. Lett.*, 57, 1046-1048, (1990).

Office Action for U.S. Appl. No. 11/010,100 dated Mar. 21, 2008 (8 pages).

Office Action for U.S. Appl. No. 11/010,100 dated Sep. 19, 2007 (6 pages).

Office Action for U.S. Appl. No. 11/010,100 dated Apr. 6, 2007 (10 pages).

Notice of Allowance for U.S. Appl. No. 10/887,792 (now U.S. Patent No. 7,091,517) dated Mar. 21, 2006 (7 pages).

* cited by examiner

PATTERNED FUNCTIONALIZED SILICON SURFACES

CROSS REFERENCE TO RELATED APPLICATIONS

This application is a divisional of U.S. patent application Ser. No. 10/887,792, filed Jul. 9, 2004, now U.S. Pat. No. 7,091,517 which claims priority under 35 U.S.C. § 119(e) to U.S. Provisional Application Ser. No. 60/486,571, filed Jul. 11, 2003, which is expressly incorporated herein by reference.

GOVERNMENT RIGHTS

Research relating to this invention was supported in part by the U.S. Government under Grants Nos. CHE-0110846 and CHE-9875150 awarded from the National Science Foundation. The U.S. Government may have certain rights in this invention.

BACKGROUND

Silicon surface chemistry is of fundamental technical significance because of the ubiquitous role of silicon in modern technology; yet silicon/organic chemistry is only just beginning to be investigated. Virtually all microprocessor chips in electronic products are based upon crystalline silicon wafers. Control of silicon surface chemistry is crucial to allow access to technologically functional thin films for fabrication of new electronic devices. In 1990, Canham and co-workers showed that silicon wafers could be etched using hydrofluoric acid to produce a porous layer that is only a few microns thick (termed porous silicon) and exhibits photoluminescence upon exposure to UV light (Canham, L. T. *Appl. Phys. Lett.* 1990, 57, 1046). The surface of porous silicon (Si) is populated with metastable Si—$H_x$ bonds (x=1,2,3), exposed Si—Si bonds, and defects such as open valence, "dangling" Si atoms. Potential applications for porous silicon include uses as chemical sensors, biosensors, optoelectronic devices such as electroluminescent displays, photodetectors, mass spectrometry (desorption ionization on silicon or DIOS), interfacing with neurons and other nerve cells, and as a matrix for photopumped tunable lasers. As a result, modification and characterization of photoluminescent porous silicon surfaces has become an area of intense interest.

Recent developments in the functionalization of porous silicon have enabled Si—C bonds to be formed on the porous-Si surface by attacking the weak Si—Si bonds of exposed nanocrystalline submaterial with Grignard or alkyllithium reagents. Grignard and alkyllithium transmetallation and the use of Lewis acid catalysis have also been used to exploit the great population of surface Si—H bonds. Thermal, radical-mediated, and UV photolytic alkene hydrosilylation has also been reported for flat Si and Si hydride surfaces. In general, chemistry that works on porous silicon also applies to flat Si (100) and Si (111) surfaces based on substantial literature precedent. Additionally, using the Si surface as a semiconducting electrode, several workers have recently reported electrochemical Si—C bond formation by direct grafting, an approach with few parallels to soluble, molecular silane chemistry. U.S. patent application Ser. No. 09/716,614, herein incorporated by reference, teaches a method of functionalizing the Si surfaces by electrochemically grafting terminal alkynes to silicon resulting in two distinct surface derivations depending on the polarity of the surface bias. Cathodic electrografting (CEG) directly attaches alkynes to the surface, whereas anodic electrografting (AEG) of alkynes yields an alkyl surface.

DETAILED DESCRIPTION

Figure 1:
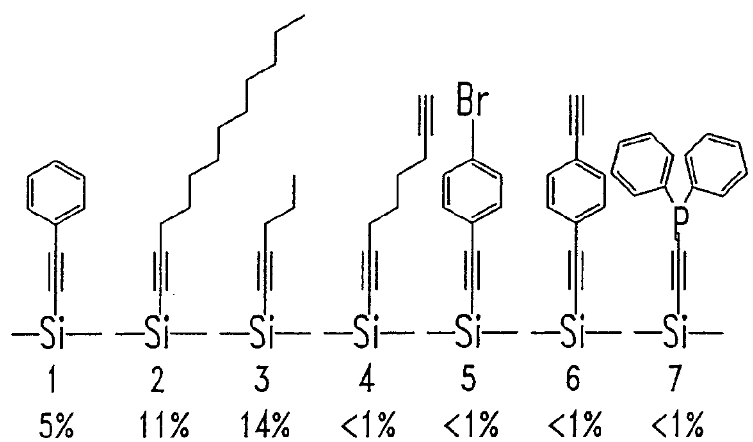
FIG. 1. Representative surfaces prepared by CEG of alkynes to porous silicon. The numbers refer to 1) phenylacetylene, 2) 1-dodecyne, 3) 1-pentyne, 4) 1,7-octadiyne, 5) p-Br-phenylacetylene, 6) 1,4-diethynylbenzene, and 7) diphenylphosphinoacetylene. The percentage below each surface represents the % photoluminescence remaining after functionalization by CEG.

The term "$C_1$-$C_x$-alkyl" refers to a straight, branched or cyclic alkyl group having the designated (x) number of carbon atoms. It is understood that, if the group is cyclic, it must have a minimum of three carbon atoms.

The term "primary, secondary or tertiary amino" represents an $R^5R^6N$-group wherein $R^5$ and $R^6$, independently, represent a hydrogen, $C_1$-$C_6$ alkyl or an aryl.

The term "optionally substituted phosphino" refers to a group of the formula $R^5R^6P$— wherein $R^5$ and $R^6$ are as defined below.

The term "optionally substituted borane (1) and borane (2)" refers to a borane (1) or borane (2) group having one or more substituents independently selected from the group consisting of hydrogen, hydroxy, $C_1$-$C_{12}$ alkoxy, $C_1$-$C_6$ alkyl, thiol and aryl.

The terms "aryl" and "heteroaryl" are used as they are understood in the art. Examples of useful aryl groups are benzyl and naphthyl. Heteroaryl groups having one or more hetero-ring atoms, wherein at least one heteroatom is nitrogen are particularly useful in the methods and compositions of this invention. Examples of such groups include pyridyl, pyrrolyl, bipyridyl phenanthrolyl, pyrazinyl and indolyl.

The term "DNA or RNA analog" refers to a chemical analog of DNA or RNA having other than a phosphate linked sugar "backbone" that is capable of forming a double stranded complex with DNA or RNA.

While reference is made to silicon, it is understood that the methods of this invention can be applied to germanium, to produce a functionalized germanium surface.

The present disclosure provides a general method for covalent modification of the surface of silicon through attachment of readily available alkynes mediated by cathodic or anodic electrografting. Alkynes subjected to anodic electrografting or cathodic electrografting in the presence of surface bound Si—H groups react with the Si—H groups to yield surface bound alkyl or alkyne groups, respectively, as outlined in scheme 1.

Scheme 1

AEG and CEG of alkynes to a porous silicon surface.

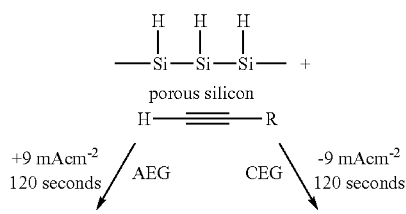

-continued

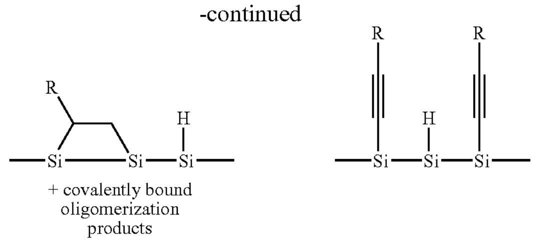

Alkynes subjected to cathodic electrografting in the presence of surface bound Si—H groups react with the Si—H groups to yield surface bound alkyne groups according to a mechanism that was determined based on data such as acid quenching and infrared spectra data (see examples) and is outlined in scheme 2.

Scheme 2

CEG-promoted hydrosilylation of alkyne groups

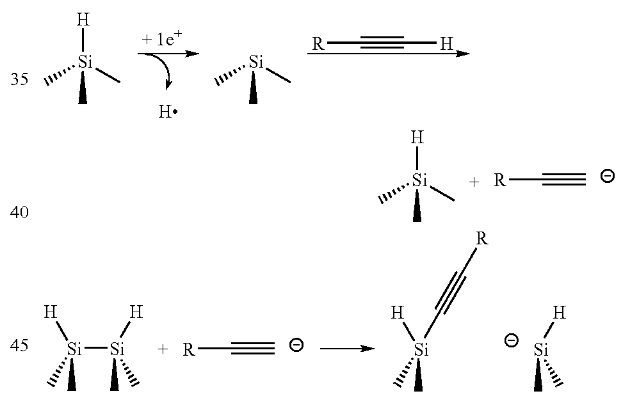

Figure 12:
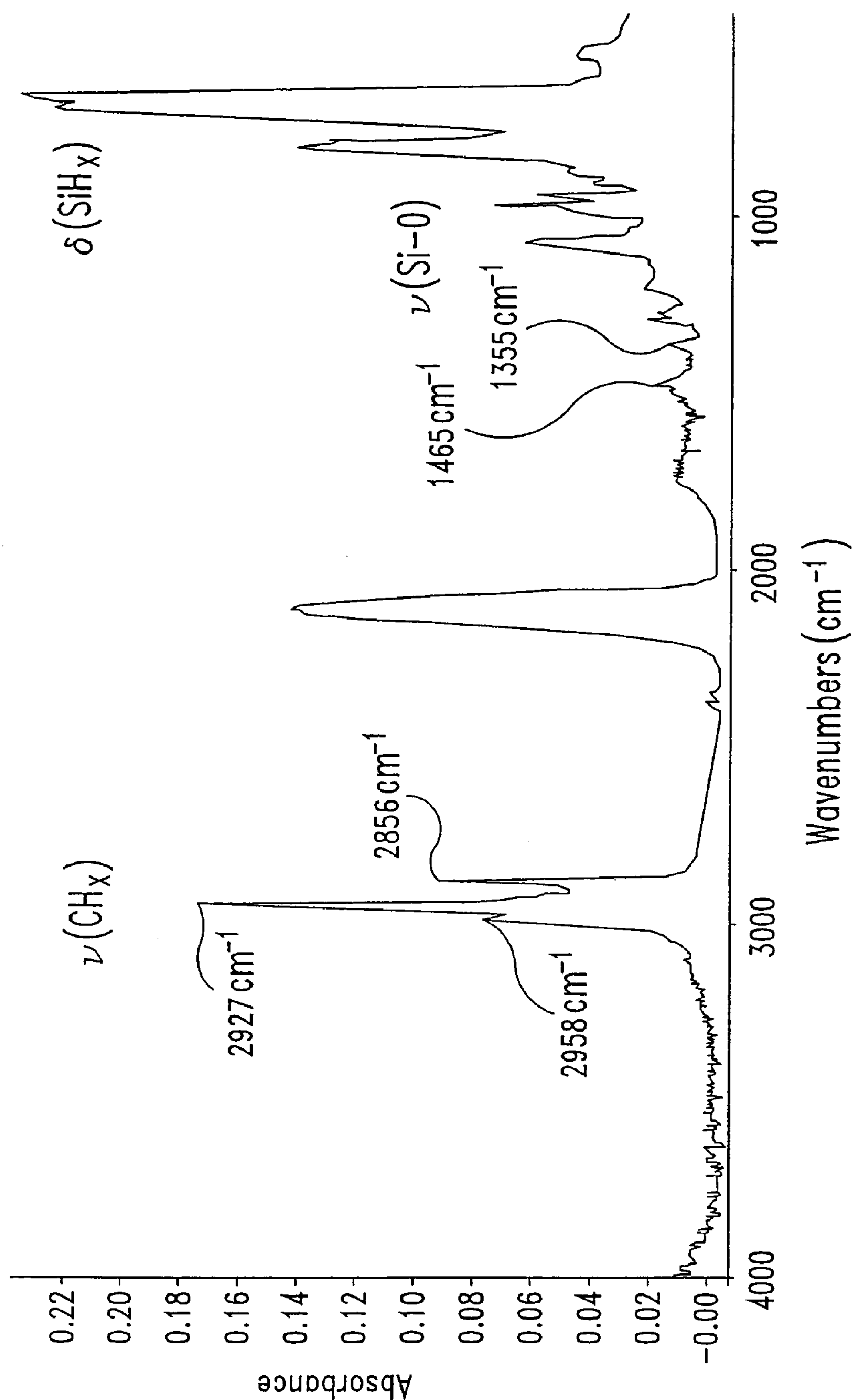
FIG. 12. CEG of 1-dodecanethiol.

The results of the CEG experiments suggest that the CEG reaction proceeds via a silyl anion intermediate formed by reduction of surface Si—H bonds in a space charge layer (see scheme 2) to yield either H. or ½ $H_2$. The silyl anion species has been previously inferred for the mechanism of alkylhalide grafting. The subsequent in situ generation of a carbanion from deprotonation of the weakly acidic allyne leads directly to nucleophilic Si—Si bond attack, as previously observed. The silyl anion is quenched in the presence of a proton source (0.1 M HCl in diethyl ether), leading to no incorporation of allyne. Other weakly acidic moieties can be grafted via this CEG reaction, such as 1-dodecanethiol (see FIG. 12), presumably through a similar deprotonation step and subsequent attack of Si—Si bonds by an RS-species. Minor incorporation of butyl groups (2956, 2923, and 2872 $cm^{-1}$), which may be due to tenacious physisorption or electrochemical decomposition of the $Bu_4NPF_6$ electrolyte, is observed in all CEG reactions. The butyl groups are not removed after 30 minutes in boiling chloroform.

Alkynes subjected to anodic electrografting in the presence of surface bound Si—H groups react with the Si—H groups to yield surface bound alkyl groups according to a mechanism that was determined based on infrared spectra data (see examples) and is outlined in scheme 3.

Scheme 3

AEG-promoted hydrosilylation of alkyne groups.

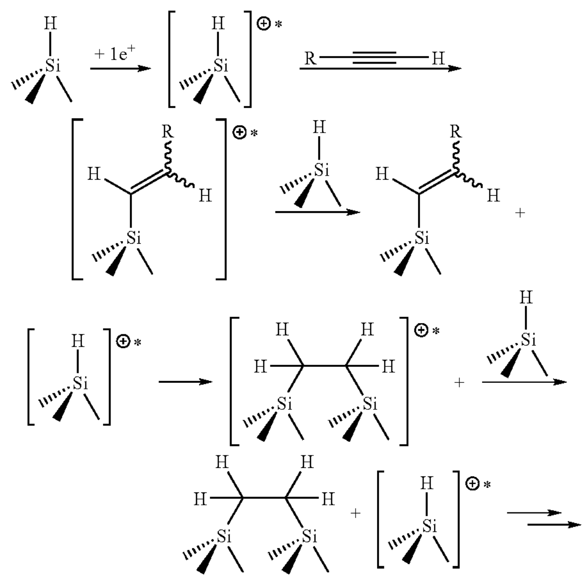

In accordance with one embodiment of the present disclosure a method for forming a patterned covalently bound monolayer of organic substituents on a porous silicon substrate having a surface comprising silicon hydride groups is provided. The method comprises the steps of contacting the surface of the porous silicon substrate with a solution or liquid comprising an optionally substituted $C_2$-$C_{24}$ alkyne, positioning a probe tip of a conductor electrode in close proximity to or in contact with the silicon surface, using the probe tip to apply an electrical potential sufficient to covalently bind at least a portion of the alkyne to the silicon surface, and moving the tip to create a predetermined pattern on the porous silicon surface.

In accordance with another embodiment of the invention a method for forming a covalently bound monolayer of organic substituents on a flat Si (100), Si (111), or Ge surface is provided. The method comprises the same steps as described in the preceding paragraph.

An electrically conductive aprotic solution optionally may be used in the methods of the present invention. The conductive solution may include any aprotic organic solvent capable of dissolving an amount of an organic salt sufficient to enable the solution to conduct current responsive to a potential capable of effecting anodic or cathodic electrografting of alkynes onto silicon surfaces. These aprotic organic solvents may include solvents such as dioxane, dimethylformamide, dimethylacetamide, sulfolane, N-methylpyrrolidine, dimethylsulfone, dichloroethane, trichloroethane, and freons, or solvents such as dichloromethane, acetonitrile, and tetrahydrofuran. The organic salt, which when dissolved in the solvent, enables the solvent solution to conduct a current in response to application of a potential is preferably a tertiary amine salt of a strong acid or a quaternary ammonium salt having an associated anion corresponding to a strong acid. Exemplary of such anions are tetrafluoroborate, perchlorate, perfluorosulfate, hexafluorophosphate, trifluoroacetate, and like anions. Organic salts comprising other quaternary ammonium salts and other solvent-soluble organic salts are also applicable to the invention. The organic salt solutions are preferably substantially anhydrous and substantially oxygen-free. The solutions are preferably maintained under dry oxygen-free conditions such as that provided by an inert atmosphere, e.g., nitrogen, or a noble gas.

In carrying out the method of the present invention, an electrical current is generated in a solution in contact with the silicon surface. Alternatively, the electrical current is generated more locally, by bringing a conductor electrode tip in close proximity to or in contact with the silicon surface. The solution comprises an amount of an alkyne, as described more specifically herein below, effective to form a substantially uniform organic monolayer on the surface of the silicon substrate during electrochemical deposition. A conductor electrode or electrode tip is positioned in communication with the alkyne, and an electrical potential is applied. The potential should be sufficient to covalently bind at least a portion of the alkyne to the silicon surface. The conductor electrode can include any conductive material such as a platinum, paladium, silver, gold, or graphite electrode. The duration of the applied potential should be sufficient to covalently bind at least a portion of the alkyne to the silicon surface.

Cathodic and anodic electrografting in accordance with the invention may be carried out on the silicon substrate in an aprotic organic solvent solution that is substantially oxygen-free to reduce oxidation of the substrate that may occur under ambient conditions. A preferred method of maintaining a substantially oxygen-free solvent solution is to carry out the electrochemical deposition in an inert atmosphere, e.g., in a glove box which has been evacuated of oxygen and filled with nitrogen. It is contemplated that other methods, normally occurring to one skilled in the art, of creating a substantially oxygen-free environment will be applicable to the invention.

In accordance with the method of the present invention the alkyne comprises optionally substituted $C_2$-$C_{24}$ alkynes. These alkynes may include, for example, 1-pentyne, 1-dodecyne, 1,7-octadiyne, phenylacetylene, p-Br-phenylacetylene, 1,4,-diethynylbenzene, diphenylphosphino-acetylene, and 1-dodecanethiol, and any other alkyne capable of being electrografted onto a silicon substrate by anodic electrodeposition or cathodic electrodeposition, providing alkyl substituted and alkynyl substituted surfaces, respectively. If the alkyne is liquid, it may be provided neat. Alternatively, the alkyne may be provided in a solution that may comprise the aprotic organic solvent. Other solutions are possible, for example a solid may be provided in 1,3,5 trimethylbenzene.

The surface may be patterned with a single type of alkyne or alkyl group, where the silicon surface is electrografted with a single type of alkyne via CEG or AEG, respectively. Alternatively, the surface may be made heterogeneous, consisting of different types of alkyne groups where CEG is performed using two or more selected alkynes, or consisting of different types of alkyl groups where AEG is performed using two or more selected alkynes. In the case of a heterogenous surface monolayer, the mole fraction of the groups in the monolayer would correspond generally to the mole fractions of the different types of alkynes in the reagent mixture used to form the monolayer. The functional groups present on any of the alkyne reactants are preferably in a "protected" form during the electrodeposition step and are thereafter deprotected on the surface to provide reactive sites for further surface functionalization, i.e., for coupling to biologically significant molecules using standard ester- or amide-forming coupling techniques. The term "protected" refers to the use of standard protecting groups that can serve to prevent unwanted reaction of reactive functional groups during one reaction (i.e., electrodeposition) and thereafter be removed to regenerate the reactive functional groups for subsequent reactions. Such protecting groups are well-known in the art.

In another embodiment of the invention, patterns of covalently bound species derived from alkynes on the silicon surface can be formed by sequential photopatterning and electrografting procedures. In accordance with this embodiment, photopatterning of alkyl and alkynyl monolayers on porous silicon surfaces is controlled by art-recognized masking and demasking techniques. The patterned, unmasked, nonfunctionalized silicon hydride groups can be selectively reacted with a particular alkyne or a mixture of alkynes using CEG or AEG.

Patterning may also be achieved using a probe tip of a conductor electrode to "write" a pattern on the silicon surface. For example, a conducting probe atomic force microscope (CP-AFM) or scanning tunneling microscope (STM) tip may be used to fabricate very fine patterns. Illustratively, the patterns may be lines about 10 molecules thick, more particularly about 5 molecules thick, and most particularly patterns may be drawn comprising lines about one molecule thick. However, depending on the application, lines of various thickness may be produced. In an illustrative embodiment, a CP-AFM tip is used under CEG conditions to covalently attach alkynes to a silicon hydride surface, creating a nanometers thick pattern of highly stable covalently bonded alkyne on silicon.

Figure 24:
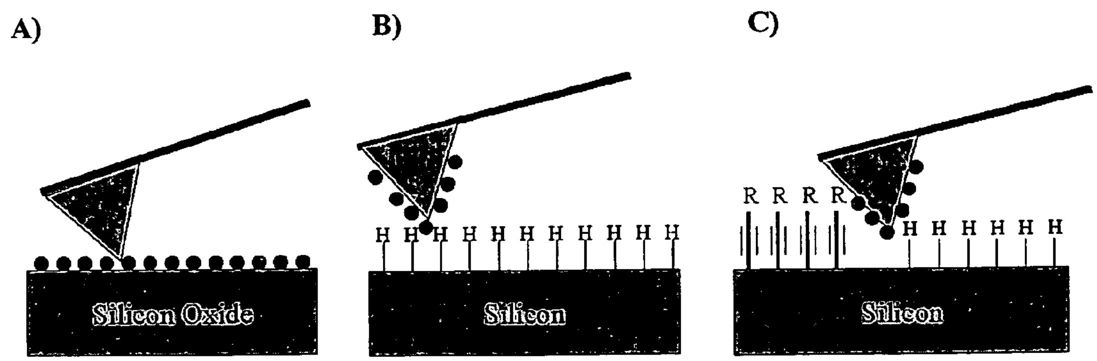
FIG. 24. (a) Schematic of platinum coated AFM tip coming into contact with alkyne on a hydrophilic silicon oxide surface. (b) Alkyne coated AFM tip coming into contact with a hydrophilic silicon hydride surface. (c) Reductive coupling reaction between surface Si—H groups and the alkyne.
Figure 25:
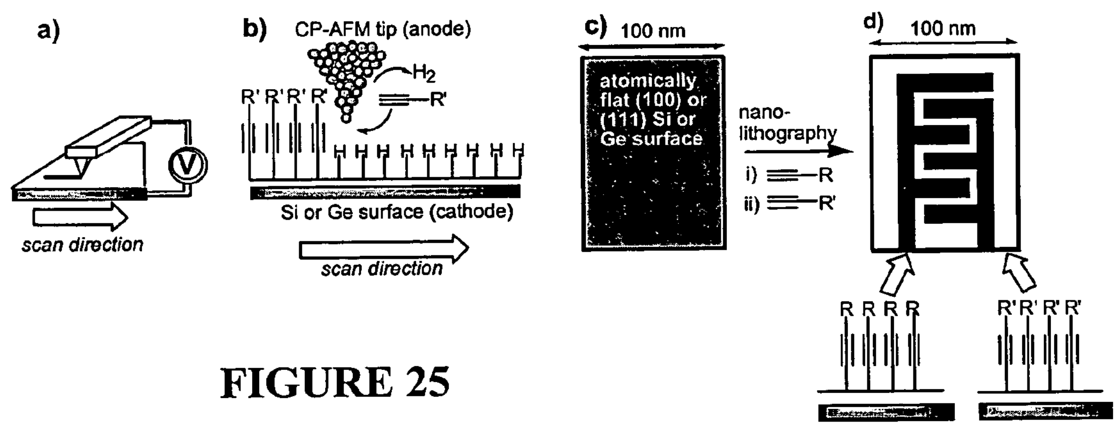
FIG. 25. (a) Schematic of the cathodic electrografting (CEG) experiment to be carried out with CP-AFM. (b) Application of a negative bias to the semiconducting surface [tip (+)] drives the reductive coupling reaction between surface Si—H groups and the alkyne. (c) Nanolithography is carried out by 'writing' with the tip, leaving covalently bound alkynyl functionalities on the surface. (d) Different areas of the surface may be patterned with dissimilar alkynes, allowing for spatially defined arrays of varying functionalities, such as the interdigitated pattern shown.

For example, a thin layer of the alkyne would be placed on a silicon oxide wafer. The tip then would be brought into contact with the alkyne and allowed to soak for 30 seconds. The silicon oxide surface is then replaced with a hydride terminated silicon surface. The purpose for wetting silicon oxide with the alkyne is to avoid covering the writing surface with obtrusive organics. This step keeps the hydride terminated surface as clean as possible for imaging. Then, in lateral force mode, the alkyne covered tip is then brought into contact with the hydride terminated surface (FIG. 24). Because the reaction takes place between the tip and semiconducting material, one molecule thick nanostructure can be manufactured into well defined lines or shapes. A scheme of this can be seen in FIGS. 25 (*a*) and (*b*). Patterns such as the interdigitated pattern of several different alkynes as shown in FIG. 25 (*d*) may be created by this method. While two different alkynes are illustrated in FIG. 25 (*d*), it is understood that any number of alkynes or mixtures of alkynes may be used, depending on the application.

In one aspect of this method, the $C_2$-$C_{24}$ alkyne is a compound of the formula:

$$R^1—C{\equiv}C—R^2$$

wherein $R^1$ is hydrogen and $R^2$ is hydrogen, hydroxy, halo, cyano, isocyano, $C_1$-$C_{18}$ alkoxy, $C_1$-$C_{18}$ carboxy, $C_1$-$C_{18}$ alkoxycarbonyl, primary, secondary or tertiary amino, thiol, optionally substituted phosphino, borane (1) or borane (2), or $C_1$-$C_{18}$ alkylthioether or an optionally substituted $C_1$-$C_{18}$ alkyl, aryl, heteroaryl or vinyl group; and when $R^2$ is a substituted group, the group is substituted with one or more substituents selected from the group consisting of hydroxy, halo, cyano, isocyano, $C_2$-$C_{24}$ alkynyl, $C_1$-$C_{18}$ alkoxy, $C_1$-$C_{18}$ carboxy, $C_1$-$C_{18}$ alkoxycarbonyl, primary, secondary or tertiary amino, thiol, optionally substituted phosphino, aryl, borane (1) or borane (2), or $C_1$-$C_{18}$ alkylthioether, halo $C_1$-$C_{18}$ alkyl, cyano $C_1$-$C_{18}$ alkyl, isocyano-$C_1$-$C_{18}$ alkyl, $C_1$-$C_{18}$ carbamido, or $C_1$-$C_{18}$ alkylthio group, a $C_1$-$C_{18}$ ferrocene substituent or another electron donor, a metal chelating ligand or a metal complex thereof, or a biologically significant ligand selected from an antibody, a receptor protein, DNA or RNA, or a DNA or RNA analog capable of forming a double or triple stranded complex with DNA or RNA.

In another embodiment, any hydroxy, carboxy, amino or thiol substituent group is in the form of protected hydroxy, protected carboxy, protected amino and protected thiol, respectively.

This invention further provides a patterned silicon substrate having a surface comprising one or more covalently bound monolayers wherein each monolayer comprises a group of the formula:

$$R—C{\equiv}C—Si$$

wherein

Si is a surface silicon atom through which the substituted or unsubstituted alkynyl group is bonded to the silicon surface; and R is hydrogen, hydroxy, halo, cyano, isocyano, $C_1$-$C_{18}$ alkoxy, $C_1$-$C_{18}$ carboxy, $C_1$-$C_{18}$ alkoxycarbonyl, primary, secondary or tertiary amino, thiol, optionally substituted phosphino, borane (1) or borane (2), or $C_1$-$C_{18}$ alkylthioether or an optionally substituted $C_1$-$C_{18}$ alkyl, aryl, heteroaryl or vinyl group; and when R is a substituted group, the group is substituted with one or more substituents selected from the group consisting of hydroxy, halo, cyano, isocyano, $C_2$-$C_{24}$ alkynyl, $C_1$-$C_{18}$ alkoxy, $C_1$-$C_{18}$ carboxy, $C_1$-$C_{18}$ alkoxycarbonyl, primary, secondary or tertiary amino, thiol, optionally substituted phosphino, aryl, borane (1) or borane (2), or $C_1$-$C_{18}$ alkylthioether, halo $C_1$-$C_{18}$ alkyl, cyano $C_1$-$C_{18}$ alkyl, isocyano-$C_1$-$C_{18}$ alkyl, $C_1$-$C_{18}$ carbamido, or $C_1$-$C_{18}$ alkylthio group, a $C_1$-$C_{18}$ ferrocene substituent or another electron donor, a metal chelating ligand or a metal complex thereof, or a biologically significant ligand selected from an antibody, a receptor protein, DNA or RNA, or a DNA or RNA analog capable of forming a double or triple stranded complex with DNA or RNA; or R, together with the carbon atoms to which it is attached, forms a 5-, 6-, 7- or 8-membered ring.

The invention also provides for a silicon substrate having a silicon surface comprising one or more covalently bound monolayers, each monolayer comprising a group of the formula:

```
  R
  |
 HC—CH2
  |   |
 Si—Si
```

wherein

Si is a surface silicon atom; and

R is hydrogen, hydroxy, halo, cyano, isocyano, $C_1$-$C_{18}$ alkoxy, $C_1$-$C_{18}$ carboxy, $C_1$-$C_{18}$ alkoxycarbonyl, primary, secondary or tertiary amino, thiol, optionally substituted phosphino, borane (1) or borane (2), or $C_1$-$C_{18}$ alkylthioether or an optionally substituted $C_1$-$C_{18}$ alkyl, aryl, heteroaryl or vinyl group; and when R is a substituted group, the group is substituted with one or more substituents selected from the group consisting of hydroxy, halo, cyano, isocyano, $C_2$-$C_{24}$ alkynyl, $C_1$-$C_{18}$ alkoxy, $C_1$-$C_{18}$ carboxy, $C_1$-$C_{18}$ alkoxycarbonyl, primary, secondary or tertiary amino, thiol, optionally substituted phosphino, aryl, borane (1) or borane (2), or $C_1$-$C_{18}$ alkylthioether, halo $C_1$-$C_{18}$ alkyl, cyano $C_1$-$C_{18}$ alkyl, isocyano-$C_1$-$C_{18}$ alkyl, $C_1$-$C_{18}$ carbamido, or $C_1$-$C_{18}$ alkylthio group, a $C_1$-$C_{18}$ ferrocene substituent or another electron donor, a metal chelating ligand or a metal complex thereof, or a biologically significant ligand selected from an antibody, a receptor protein, DNA or RNA, or a DNA or RNA analog capable of forming a double or triple stranded complex with DNA or RNA; or R together with the carbon atoms to which it is attached, forms a 5-, 6-, 7- or 8-membered ring.

Preferred aspects of this invention are those silicon surfaces that contain bound alkyne groups where $R^2$ is an aryl or heteroaryl or phosphino metal chelating ligand and any metal complex of this metal chelating ligand.

Another preferred aspect of this invention are those silicon surfaces wherein at least a portion of the covalently bound $R^2$ group comprises a biologically significant ligand.

Hydrosilylation of alkynes with surface situated silicon hydride groups on a silicon surface promoted by electrografting yields a wide variety of chemical groups covalently bound to the surface. The present method is tolerant of alkynes substituted with functional groups such as phenyl, alkyl, and phenylphosphino groups which can be used to form covalently bound monolayers on silicon surfaces without additional protecting groups.

Another advantage of this invention is that it allows formation of a surface-protecting monolayer under relatively mild conditions, i.e., at room temperature (about 20-25° C.). Moreover, silicon having a monolayer of covalently bound organic groups demonstrates remarkable chemical resistance. For example, when silicon functionalized with organic groups using this method was subjected to boiling in aqueous NaOH solution (pH 10), no oxidation was seen and only minor changes in the surface IR spectra were noted. When nonfunctionalized silicon is subjected to those same conditions, the layer is destroyed in approximately 180 seconds. Because of the high stability displayed by silicon surfaces protected in accordance with this invention, this methodology represents an important step towards the use of silicon in technologically important applications.

In order to illustrate the operation of this invention, the following non-limiting examples are provided:

EXAMPLE 1

Preparation of Porous Silicon and FT-IR and Photoluminescence Measurements

FT-IR spectra. The spectra were collected using either a Perkin-Elmer 2000 or a Nicolet Nexus 670 FT-IR spectrometer with a DTGS detector, in transmission mode, typically obtained at 4 $cm^{-1}$ resolution with 16 or 32 scans collected, respectively.

Preparation of porous silicon. Porous silicon (1.12 $cm^2$) was prepared by anodization of prime-grade n-type, P-doped, 0.65-0.95 Ω-cm silicon. The etching was carried out with a 24% HF/24% $H_2O$/52% ethanol etching solution for 3 minutes at +76 mA $cm^{-2}$ under 25 mW $cm^{-2}$ white light illumination. The applied current was controlled using an EG & G instruments, Princeton Applied Research Potentiostat/Galvanostat Model 363 instrument in constant current mode. After anodization samples were washed with ethanol and hexane before being dried under a stream of nitrogen.

Photoluminescence measurements. PL measurements were recorded using an Oriel 250W mercury arc lamp and a Bausch and Lomb monochromator set to 450 nm as the excitation source. Emission was observed through a 495 nm LWP filter (GG495) with an Acton Research Spectra Pro 275 monochromator (0.275 m) and Princeton Instruments liquid $N_2$ cooled CCD detector (model LN/CCD-1024-E/1).

Syntheses of 1-phenyl-2-(trimethylsilyl)acetylene and 1-trimethylsilyldodecyne. Syntheses of 1-phenyl-2-(trimethylsilyl)acetylene and 1-trimethylsilyldodecyne were achieved using a method similar to that reported by C. Eaborn and D. R. M. Walton, *J. Organomet. Chem.,* 1965, 4, 217, reaction conditions which are directly analogous to those reported by Weber in W. P. Weber, *Silicon Reagents for Organic Synthesis*, Springer-Verlag, New York, 1983, p. 150.

EXAMPLE 2

Preparation of Functionalized Silicon by Electrografting

Electrografting. Electrochemical grafting is carried out in a Vacuum Atomospheres Nexus One glove box filled with nitrogen. AEG and CEG carried out on porous silicon under ambient conditions results in large-scale oxidation of the surface with surface oxidation appearing to be in competition with the alkyne grafting. An ohmic contact is established between the backside of the porous Si sample and a sheet of aluminum foil. A 35-40 μl aliquot of alkyne and 1 ml of 0.1 M tetrabutylammonium hexafluorophosphate in $CH_2Cl_2$ are applied to the porous Si sample and a platinum loop is used as the counter electrode. A current is then applied (+10 mA for AEG, −10 mA for CEG), typically for 120 seconds. Afterwards, the sample is removed from the glove box, and gently washed with $CH_2Cl_2$/pentane and dried under a nitrogen stream. The porous Si surfaces are then characterized by transmission mode FT-IR spectroscopy.

EXAMPLE 3

FT-IR Analysis of CEG Phenylacetylene

Figure 4:
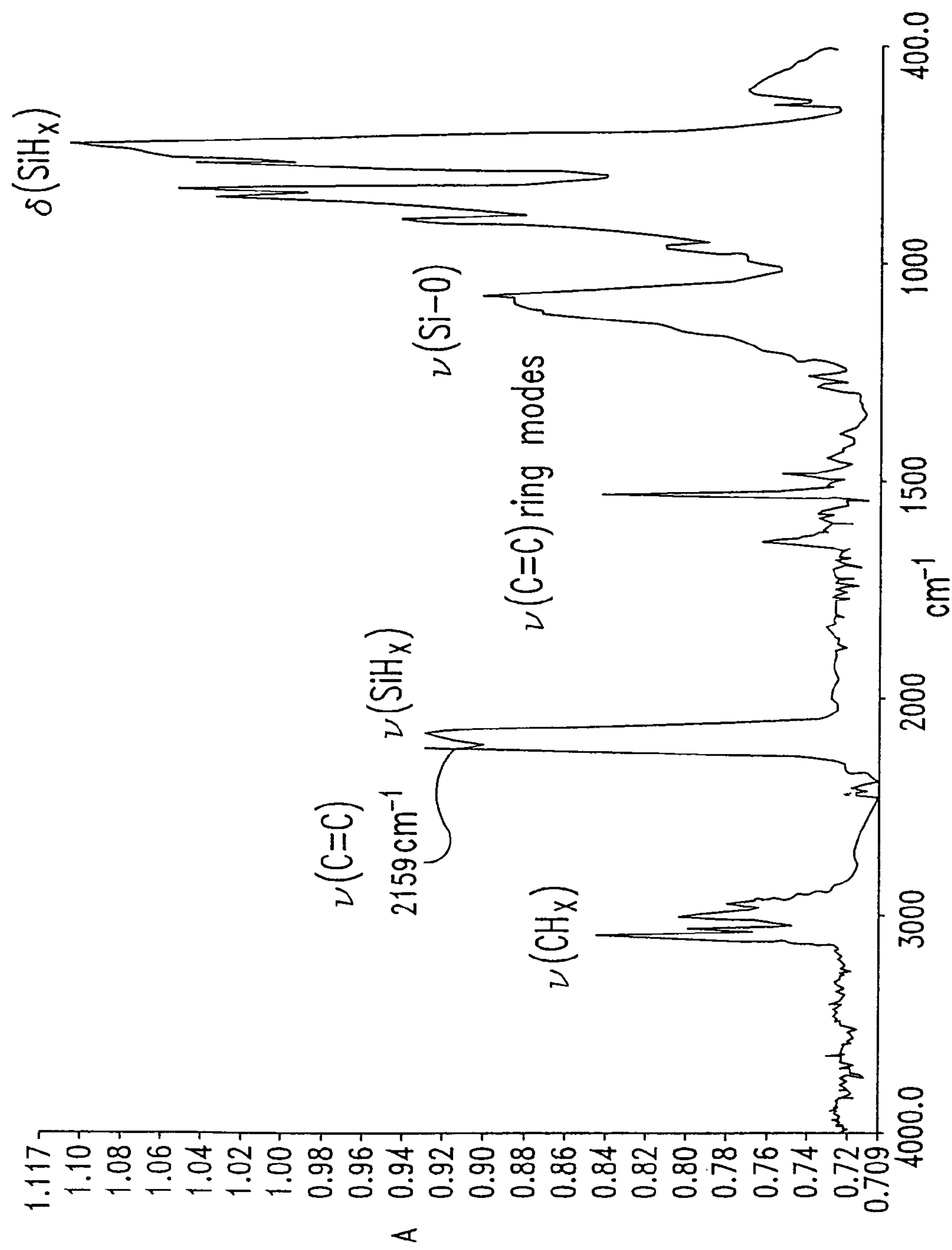
FIG. 4. CEG of phenylacetylene.

The same general procedures for preparation of porous silicon, electrografting, and FT-IR spectra measurements were followed as set forth in examples 1 and 2. FT-IR analysis of CEG phenylacetylene reveals Si—$H_x$ stretches which are broadened and decreased in integrated intensity compared to unmodified porous silicon. The absence of a ν(≡C—H) mode around 3300 $cm^{-1}$ and an observed sharp silylated alkyne ν(C≡C) at 2159 $cm^{-1}$ is consistent with a Si-alkynyl surface and not simple physisorption. For instance, the ν(C≡C) of 1-phenyl-2(trimethylsilyl)-acetylene appears at 2160 $cm^{-1}$ while that of phenylacetylene is observed at 2110 $cm^{-1}$ (see FIG. 4).

EXAMPLE 4

FT-IR Analysis OF CEG 1-Dodecyne

Figure 2:
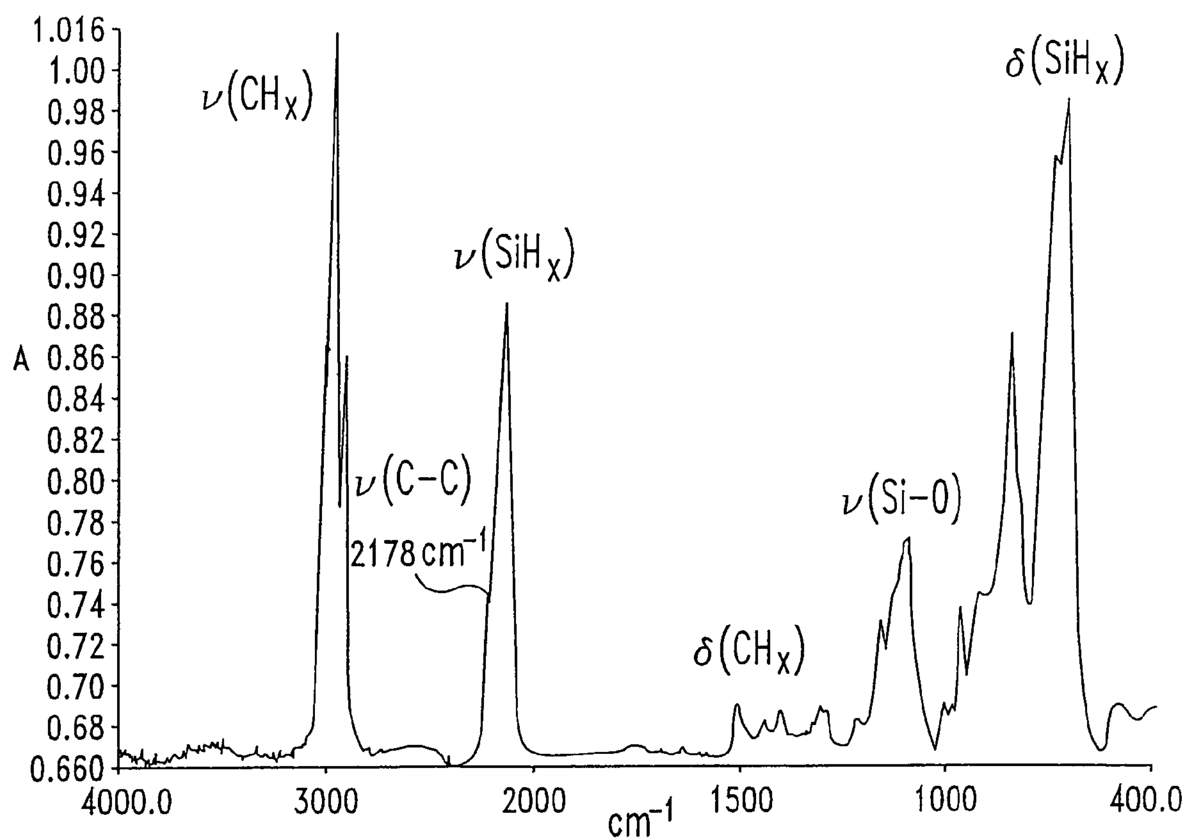
FIG. 2. CEG of 1-dodecyne.
Figure 3:
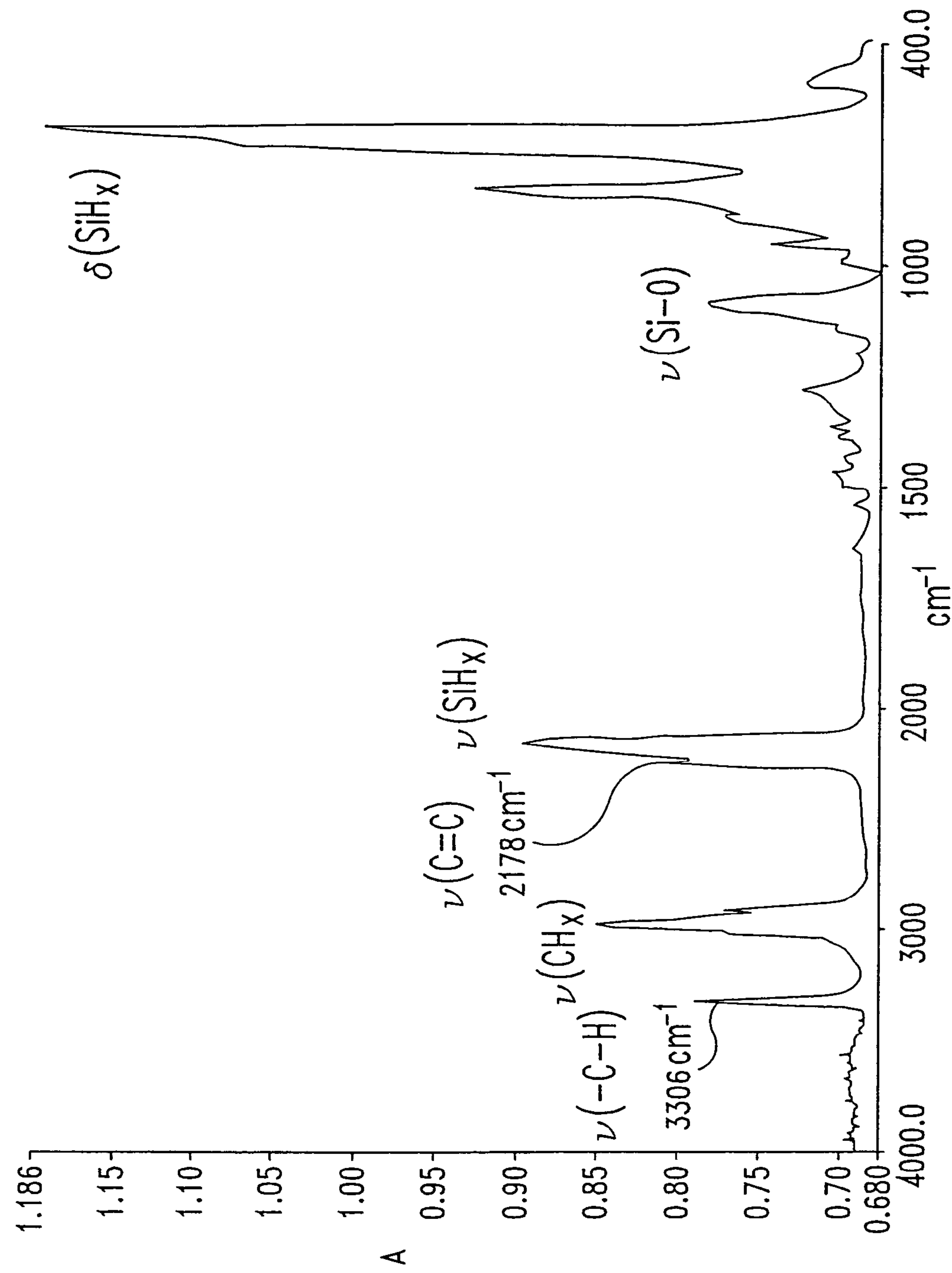
FIG. 3. CEG of 1,7-octadiyne.

The same general procedures for preparation of porous silicon, electrografting, and FT-IR spectra measurements were followed as set forth in examples 1 and 2. CEG of 1-dodecyne shows a ν(C≡C) at 2176 $cm^{-1}$, 1-trimethylsilyldodecyne at 2176 $cm^{-1}$, and 1-dodecyne at 2120 $cm^{-1}$ (see FIG. 2).

EXAMPLE 5

Hydroboration OF 1-Pentynyl

Figure 15:
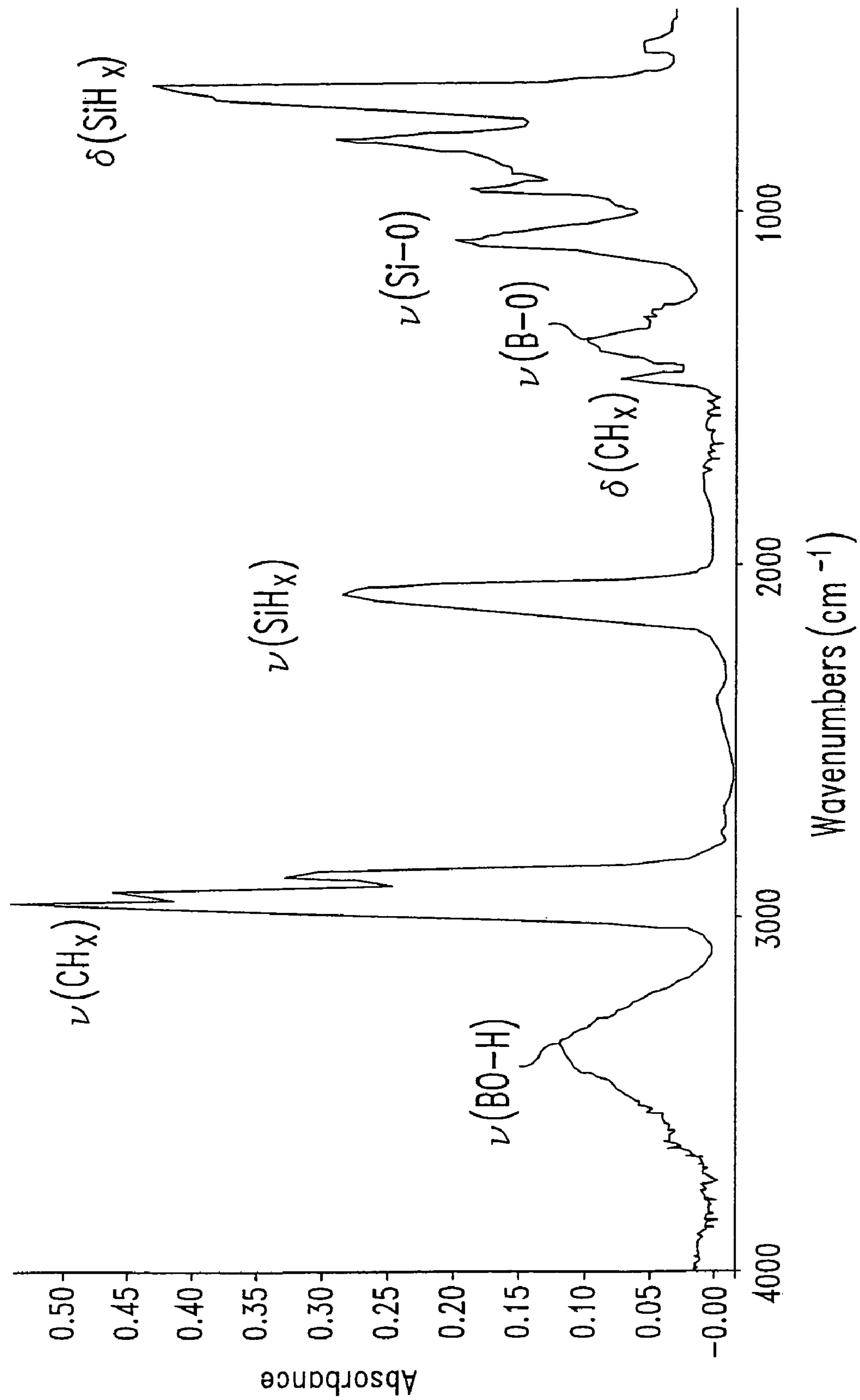
FIG. 15. BH3.THF hydroborated 1-pentynyl.
Figure 16:
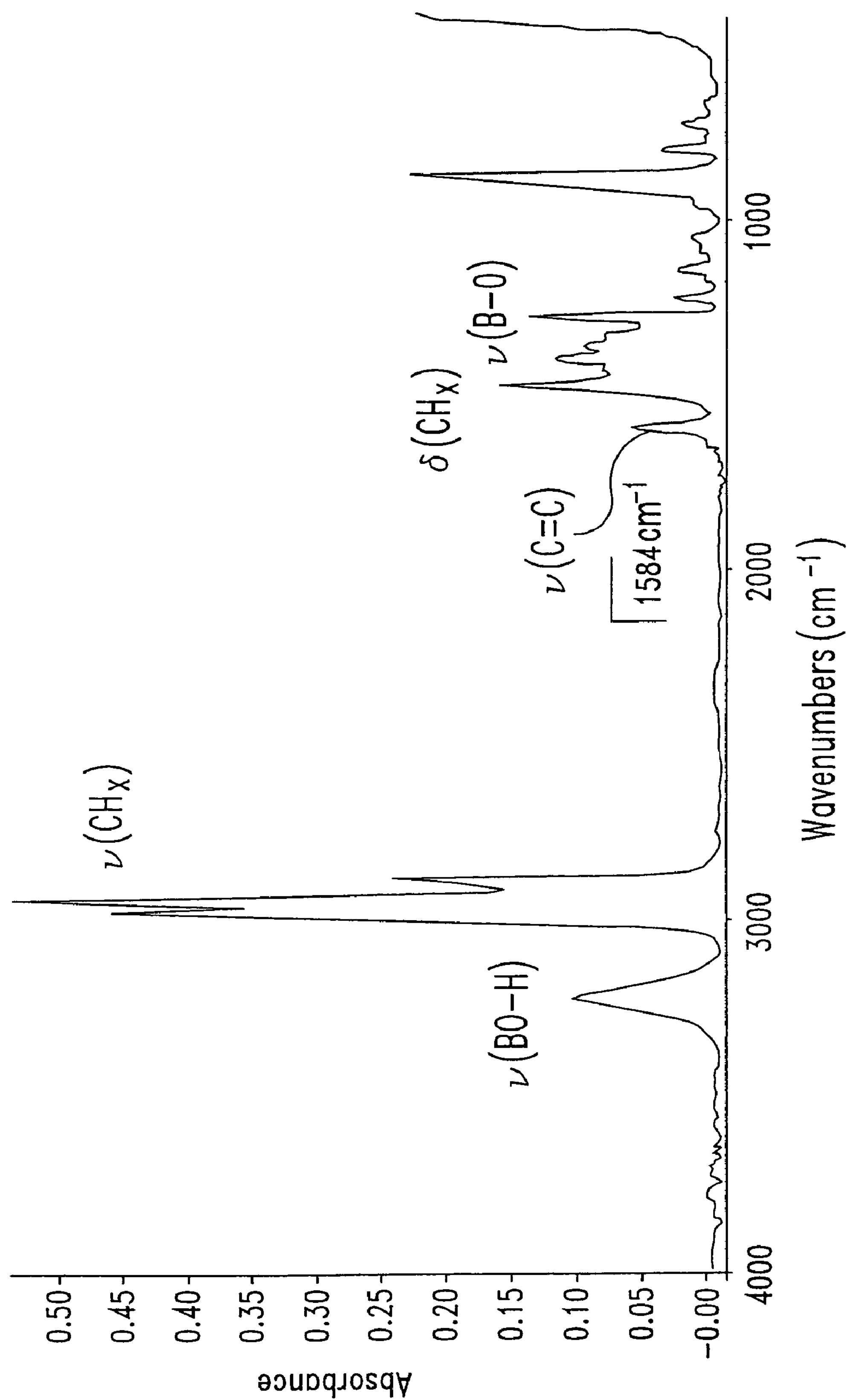
FIG. 16. Disiamylborane hydroborated 1-trimethylsilyl-dodecyne.
Figure 17:
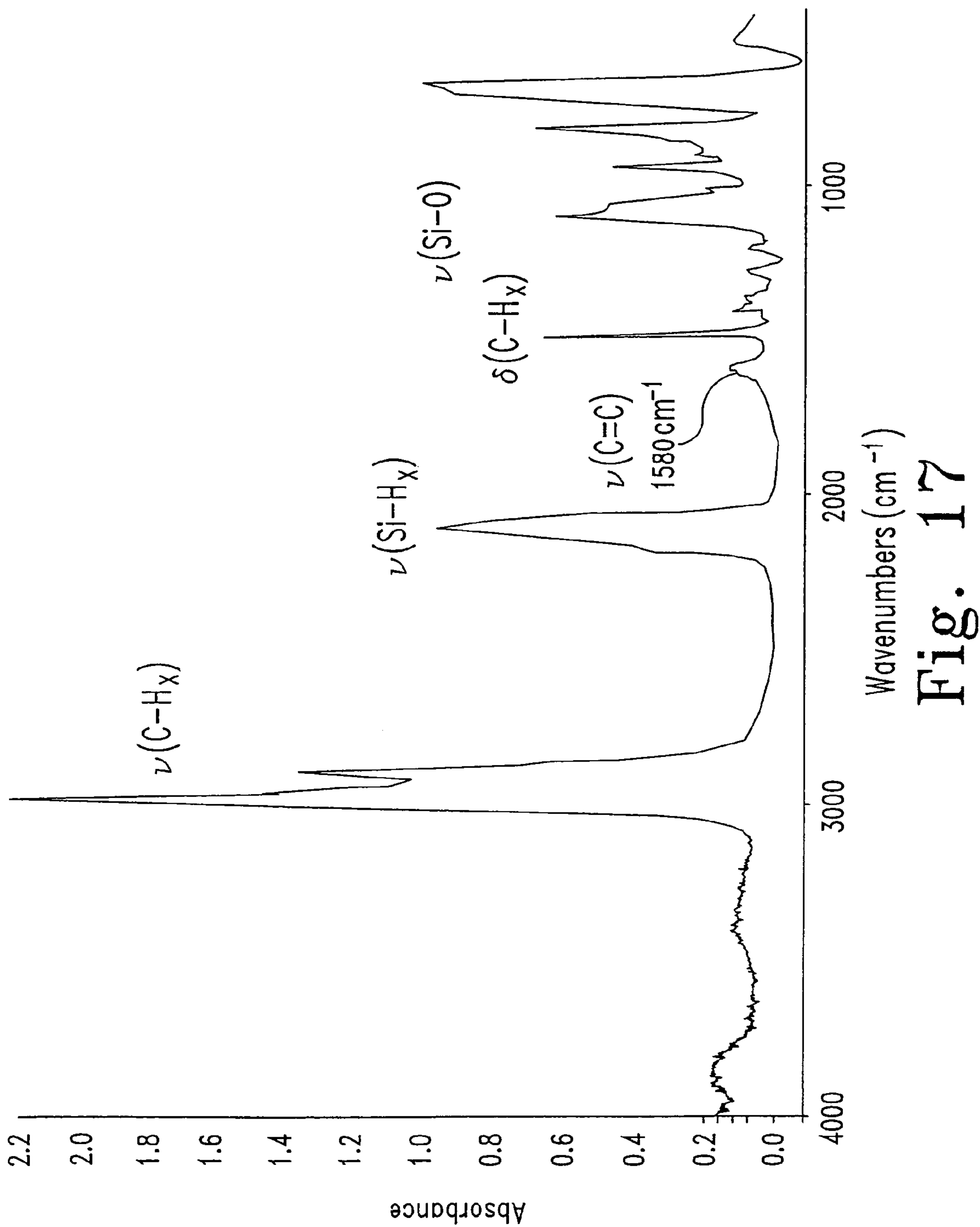
FIG. 17. Disiamylborane hydroborated 1-pentynyl.
Figure 18:
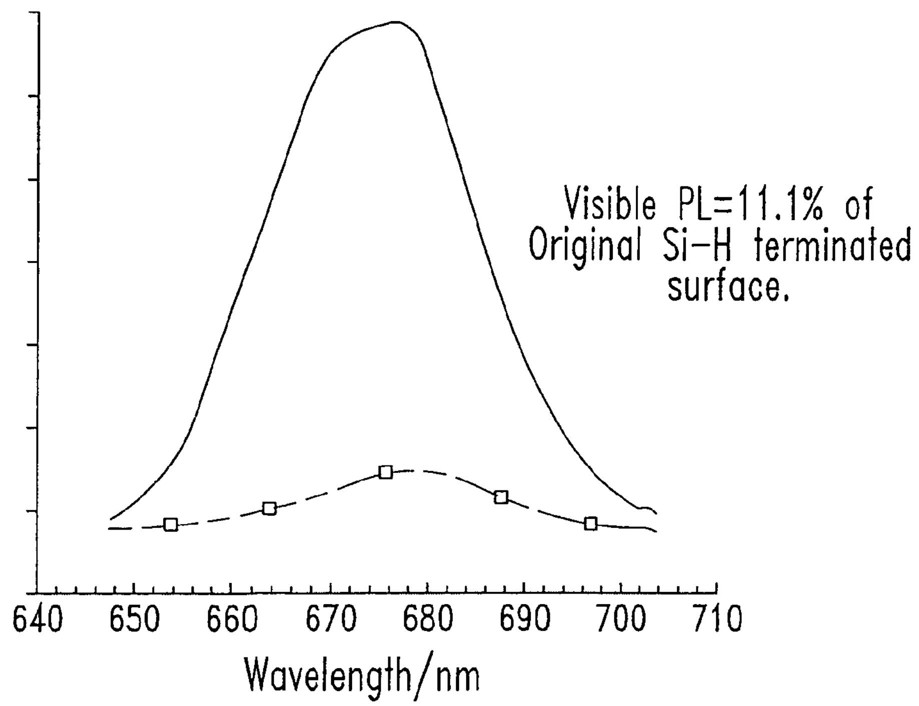
FIG. 18. Photoluminescence (PL) of freshly etched porous silicon (solid line) and 1-pentynyl (dotted line) grafted by CEG.
Figure 19:
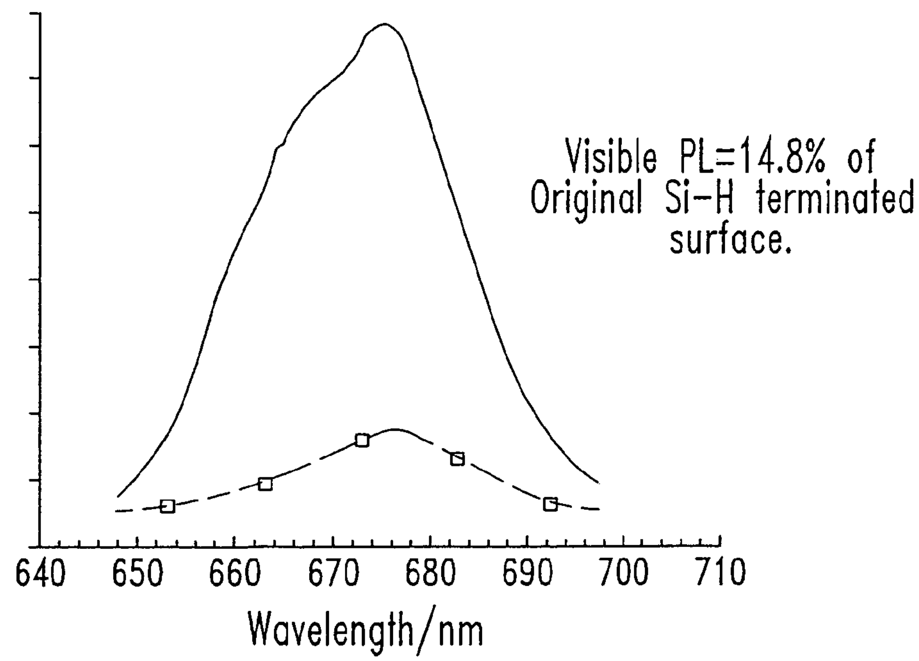
FIG. 19. PL of freshly etched porous silicon (solid line) and 1,7-octadiyne (dotted line) grafted by CEG.
Figure 20:
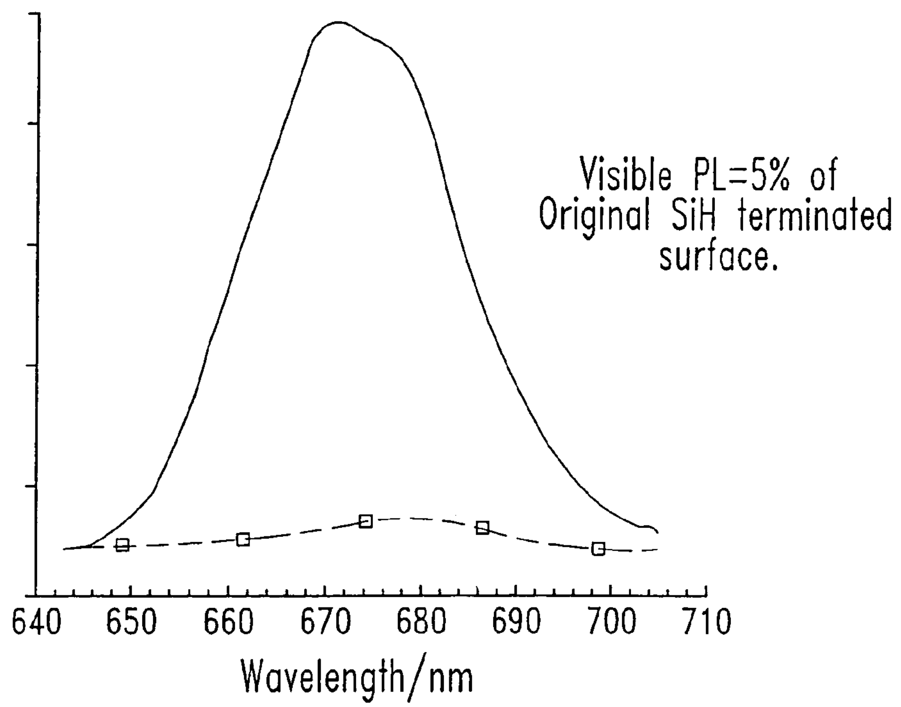
FIG. 20. PL of freshly etched porous silicon (solid line) and 1-dodecyne grafted by CEG (dotted line).

The same general procedures for preparation of porous silicon, electrografting, and FT-IR spectra measurements were followed as set forth in examples 1 and 2. The 1-pentyl surface was hydroborated with $BH_3$.THF or a 0.5 M THF solution of disiamylborane to verify the presence of the silylated triple bond (see FIGS. 15 and 17). The appearance of a broad band at 1580 $cm^{-1}$ and the concomitant consumption of the ν(C≡C) is indicative of a silylated, borylated double bond, which was verified by hydroboration of 1-trimethylsilyldodecyne and FT-IR analysis [ν(C═C) at 1584 $cm^{-1}$)] (see FIG. 16).

EXAMPLE 6

FT-IR OF AEG 1-Dodecyne

Figure 8:
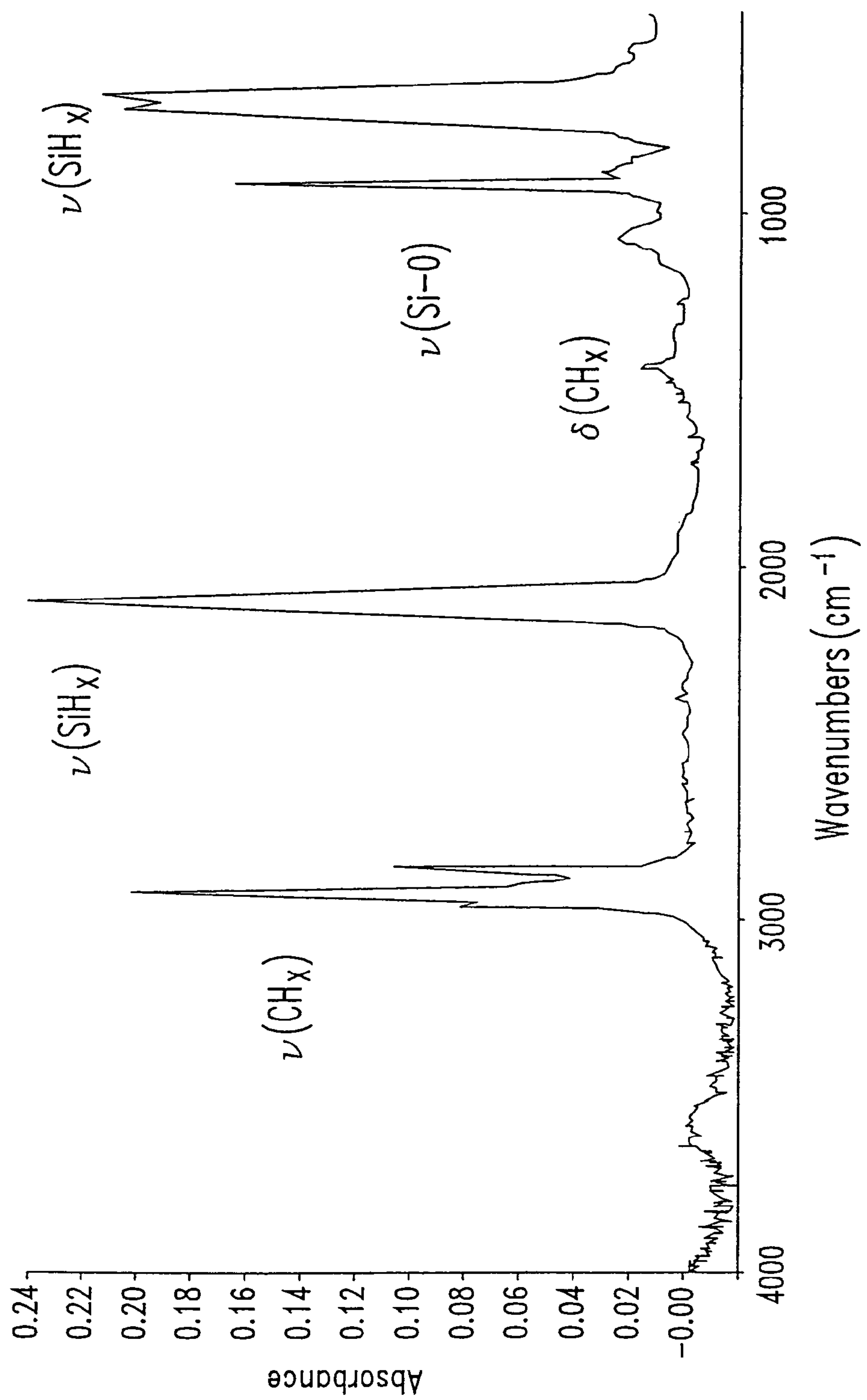
FIG. 8. AEG of 1-dodecyne.

The same general procedures for preparation of porous silicon, electrografting, and FT-IR spectra measurements were followed as set forth in examples 1 and 2. Covalent electrografting of alkynes also appears to occur when an anodic potential is applied, although AEG surfaces show complete reduction of all unsaturated bonds. The C≡C triple bond is not observed (~2180 $cm^{-1}$), along with only a weak vibration corresponding to a hydrosilylated double bond mode (1600 $cm^{-1}$) in the FT-IR spectra. In contrast to CEG, AEG of 1-dodecyne has features relating only to aliphatic C—H bonds (see FIG. 8).

EXAMPLE 7

FT-IR Of AEG Phenylacetylene

Figure 9:
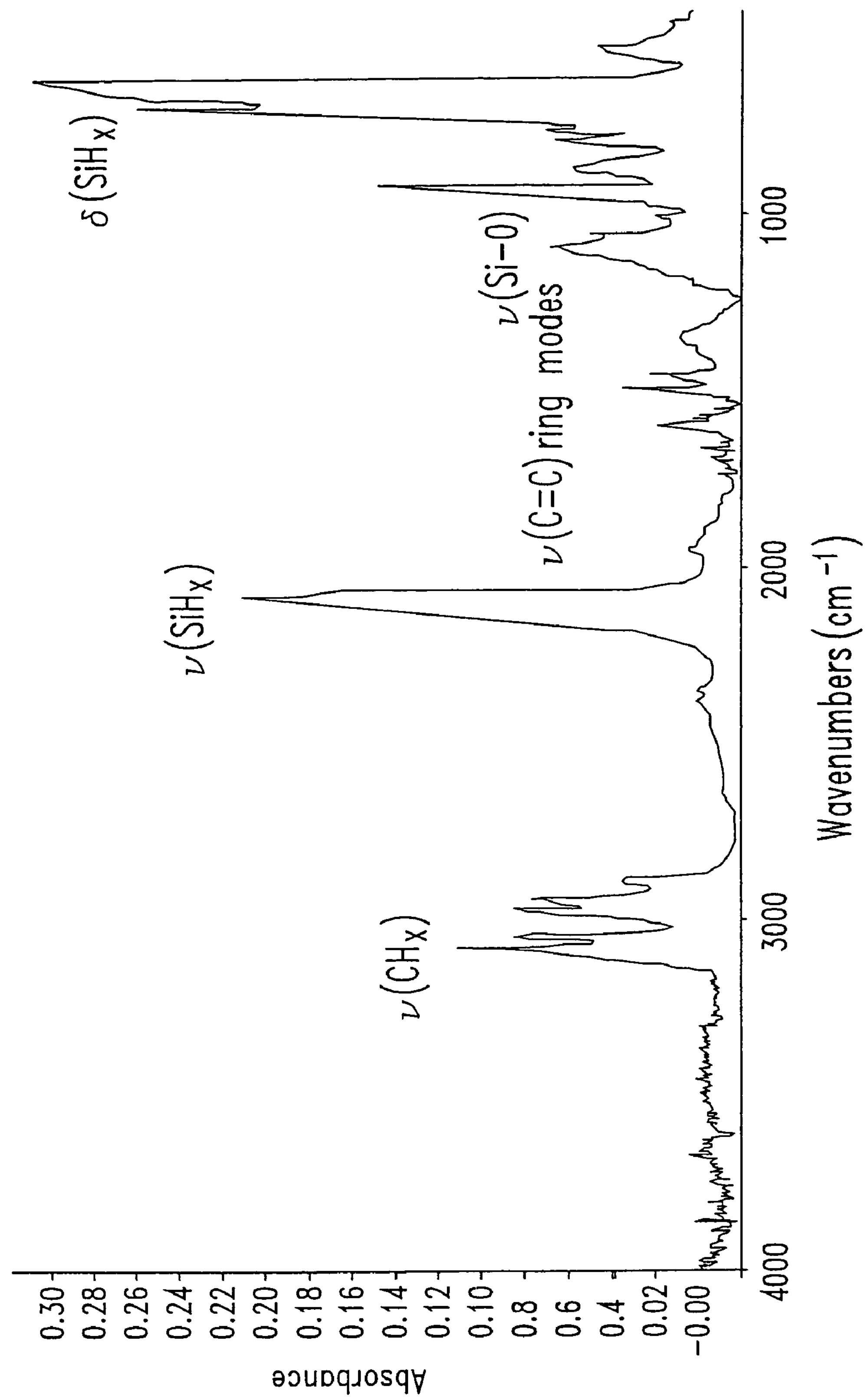
FIG. 9. AEG of phenylacetylene.

The same general procedures for preparation of porous silicon, electrografting, and FT-IR spectra measurements were followed as set forth in examples 1 and 2. In the spectrum of phenylacetylene AEG, ring breathing modes at 1599 $cm^{-1}$, 1493 $cm^{-1}$, and 1446 $cm^{-1}$ compare closely with polystyrene films and differ from those observed for the CEG surface of phenylacetylene at 1596 $cm^{-1}$, 1489 $cm^{-1}$, and 1443 $cm^{-1}$ (see FIGS. 4 and 9). Given the observations noted in FT-IR of the surfaces after AEG of 1-dodecyne and 1-phenylacetylene, it is likely that a surface-initiated cationic hydrosilylation mechanism is responsible for the Si—C bond formation in AEG reactions. Positive charges are stabilized in the depletion layer at the semiconductor-electrolyte interface, which are attacked by alkyne monomers. This can then be the starting point for a successive hydrosilylation or cationic polymerization reaction.

EXAMPLE 8

Boiling of Surfaces Functionalized through AEG or CEG

Figure 10:
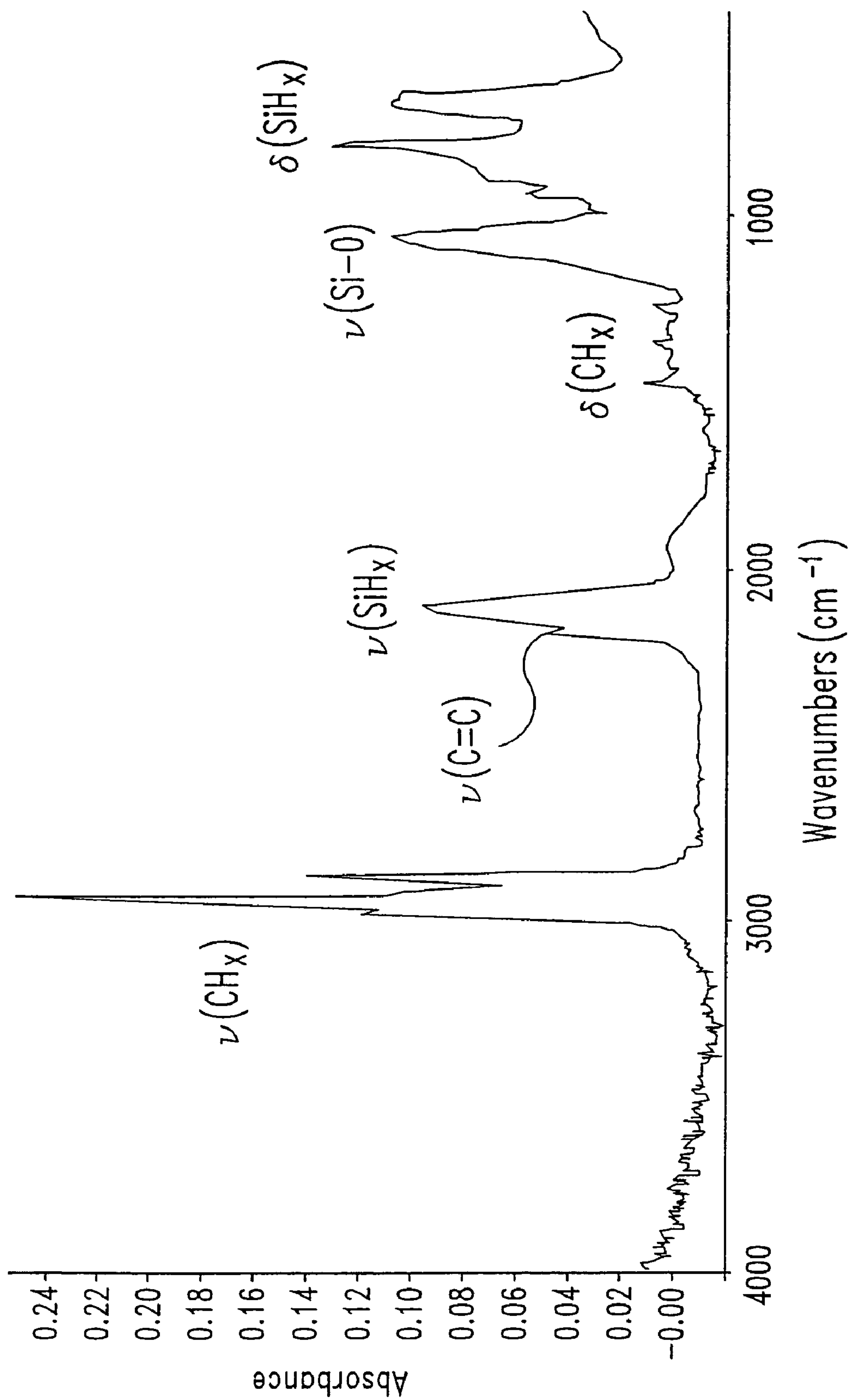
FIG. 10. CEG of 1-dodecyne after 10 minutes of boiling in NaOH.
Figure 11:
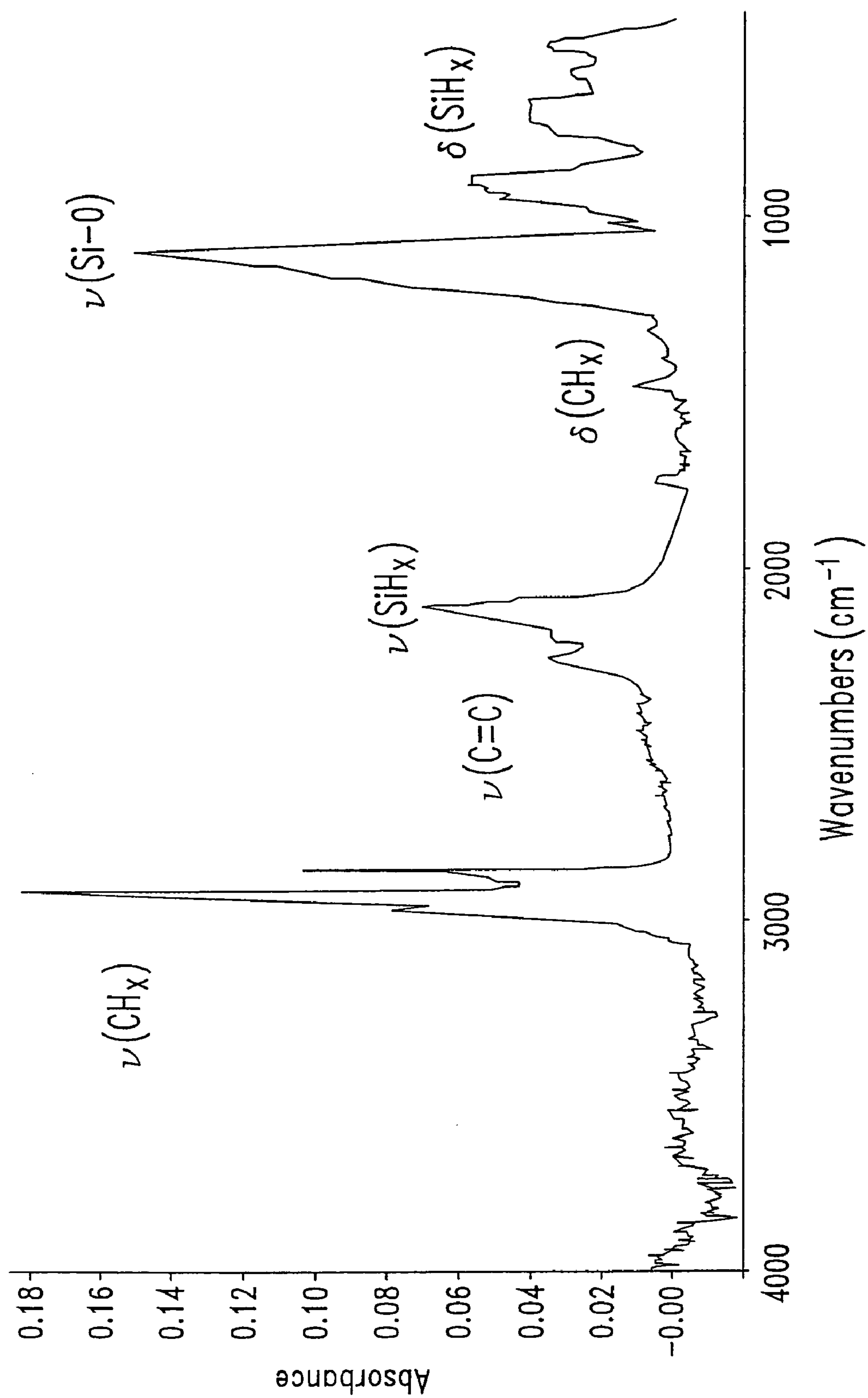
FIG. 11. AEG of 1-dodecyne after 10 minutes of boiling in NaOH.

The same general procedures for preparation of porous silicon, electrografting, and FT-IR spectra measurements were followed as set forth in examples 1 and 2. Boiling of the surfaces functionalized through AEG for 30 minutes in $CHCl_3$ results in no change in FT-IR, suggesting covalent bonding as opposed to physisorption. Based on the coincidence of the ring modes and the saturation of the C≡C bonds, we conclude that doubly hydrosilylated (bis-silylation) or possibly oligomeric material decorates the porous silicon surface (see FIG. 11). Stability tests using boiling aqueous NaOH solution (pH 10) demonstrate the chemical resistance of AEG and CEG samples compared to unfunctionalized porous silicon. Unmodified surfaces are destroyed when boiled in NaOH in about 180 seconds, while the CEG functionalized samples remain essentially unchanged after 10 minutes but for an increase in the ν (Si—O) mode at 1050 $cm^{-1}$ (see FIG. 10). Extended treatment with ethanolic HF solution also results in no change in FT-IR spectra. The combined stability with respect to both HF and alkaline treatment is known only for Si systems with covalently attached organic layers.

EXAMPLE 9

Photoluminescence Spectra of CEG and AEG Samples

Figure 5:
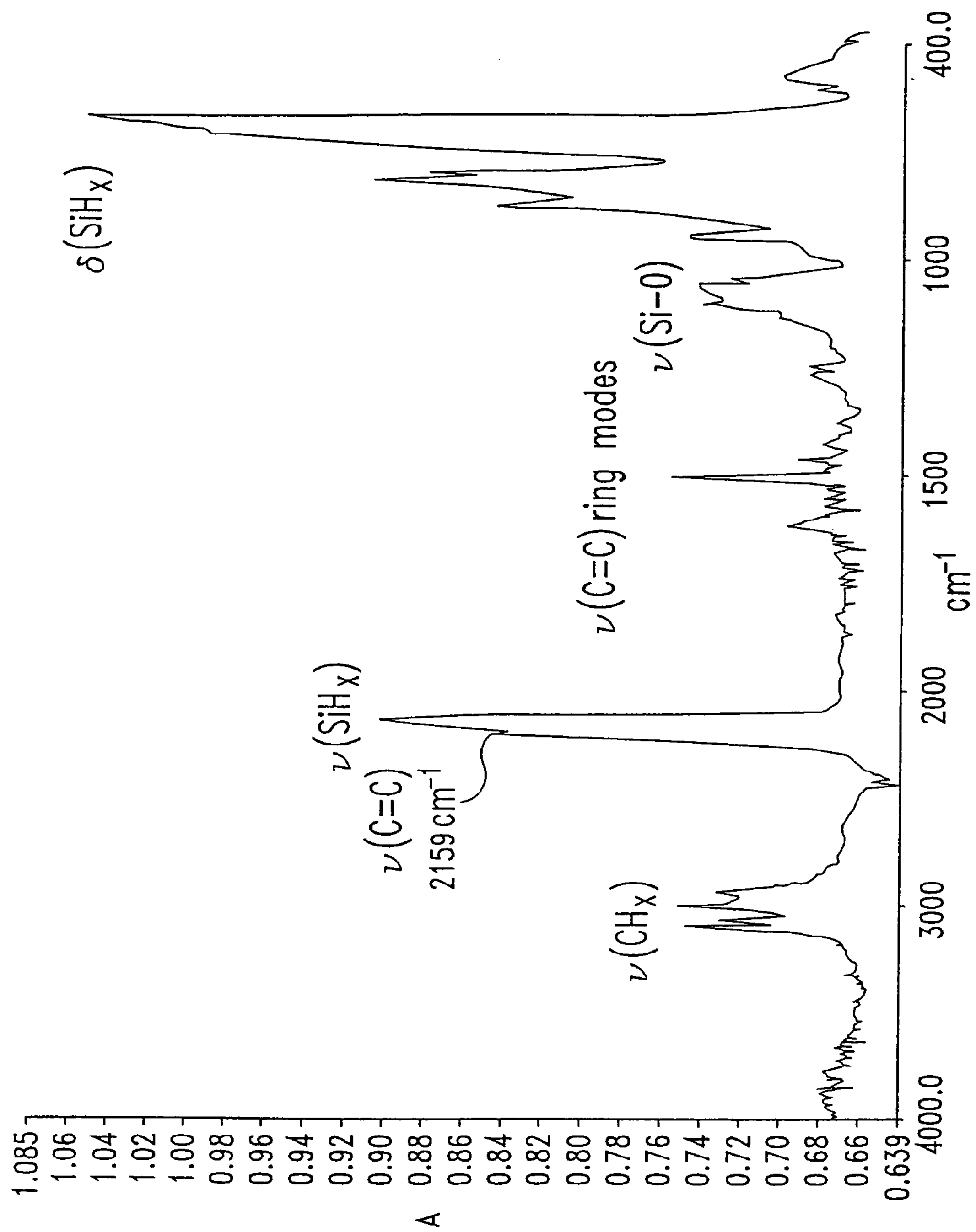
FIG. 5. CEG of p-Br-phenylacetylene.
Figure 6:
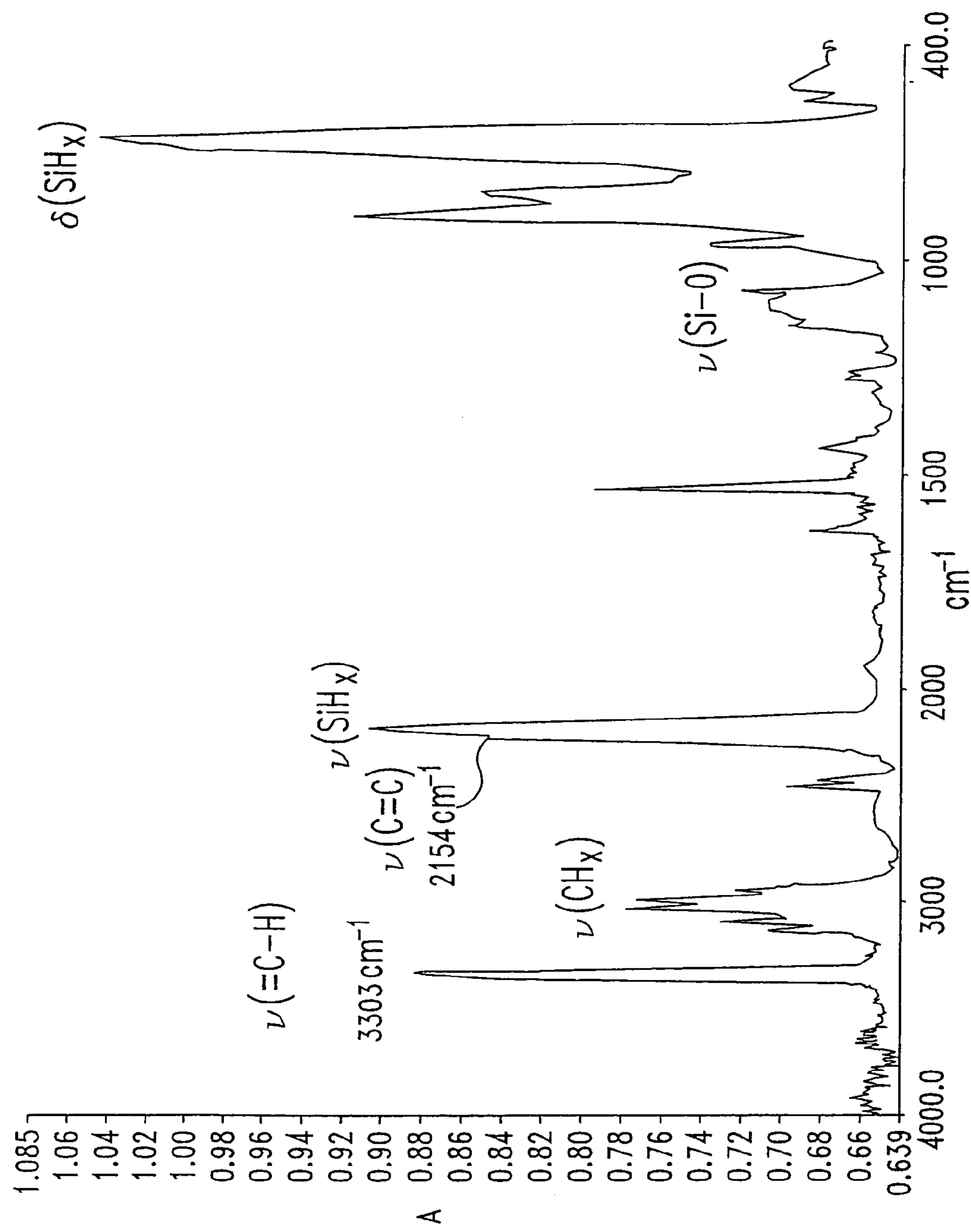
FIG. 6. CEG of 1,4-diethynylbenzene.
Figure 7:
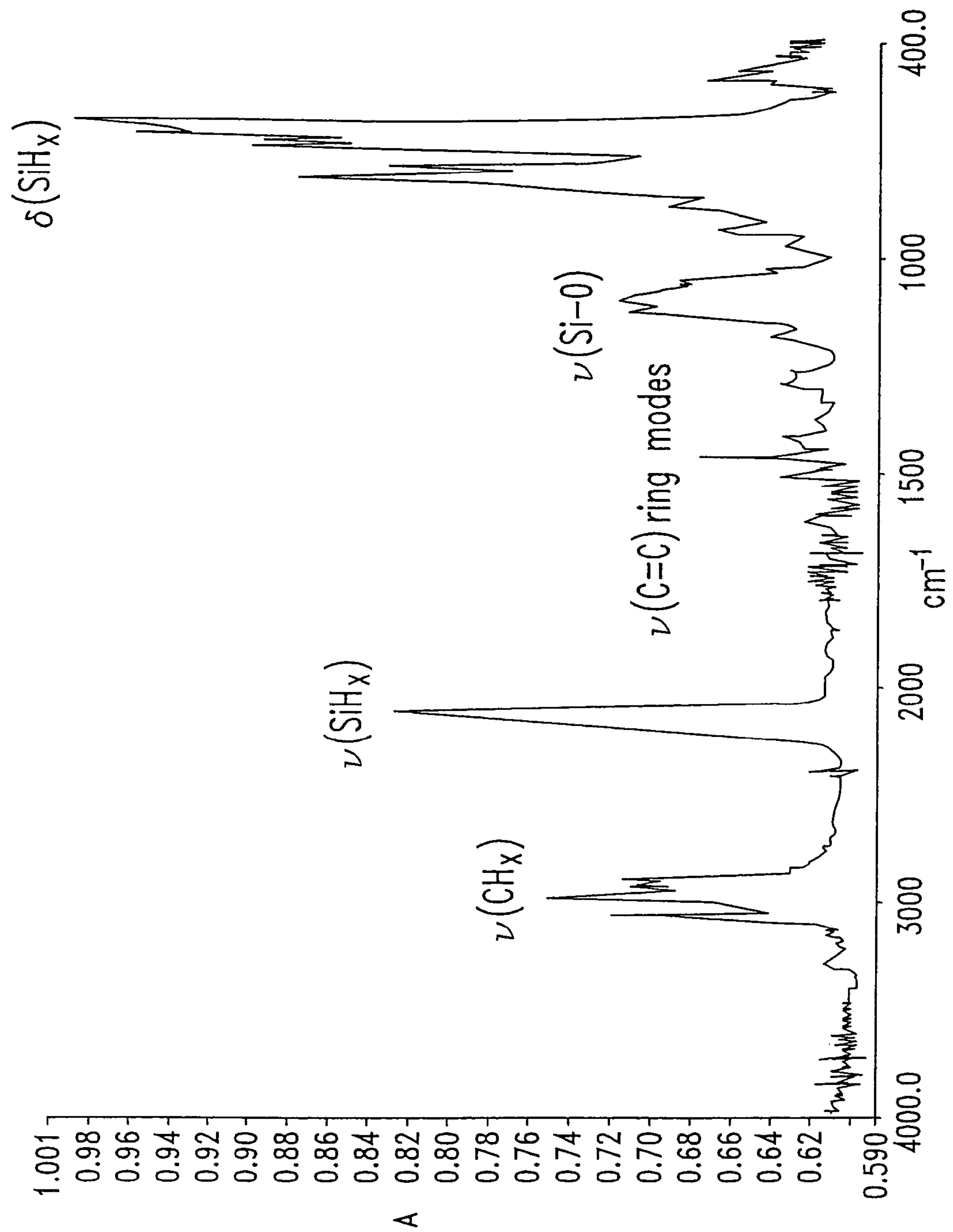
FIG. 7. CEG of diphenylphosphinnoacetylene.
Figure 13:
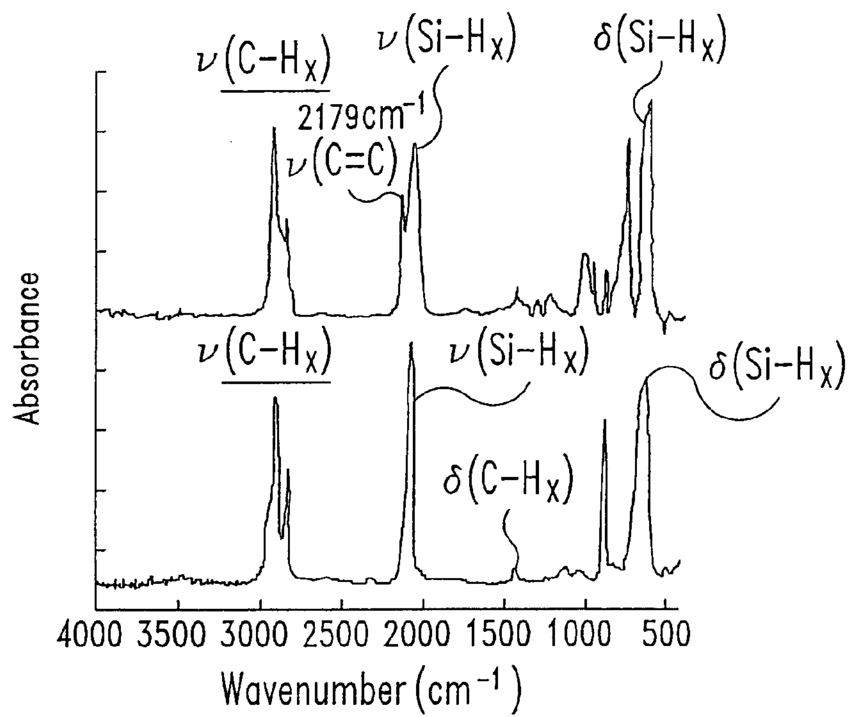
FIG. 13. CEG of 1-pentyne (top panel) and AEG of 1-dodecyne (bottom panel).
Figure 14:
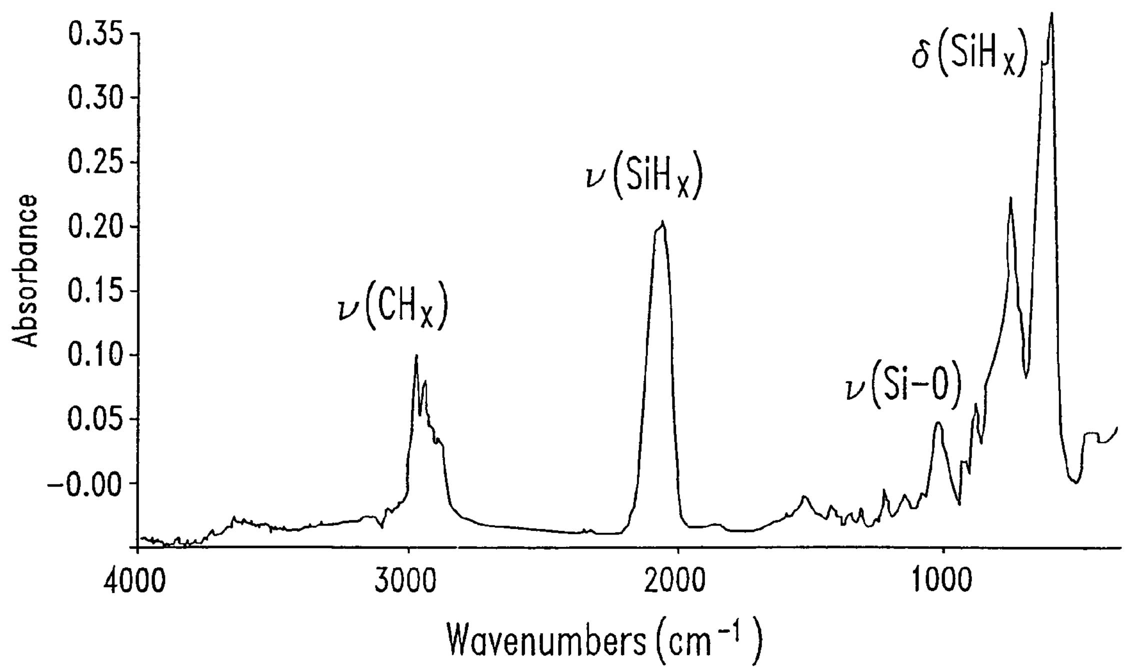
FIG. 14. CEG reaction carried out in the absence of alkyne.
Figure 21:
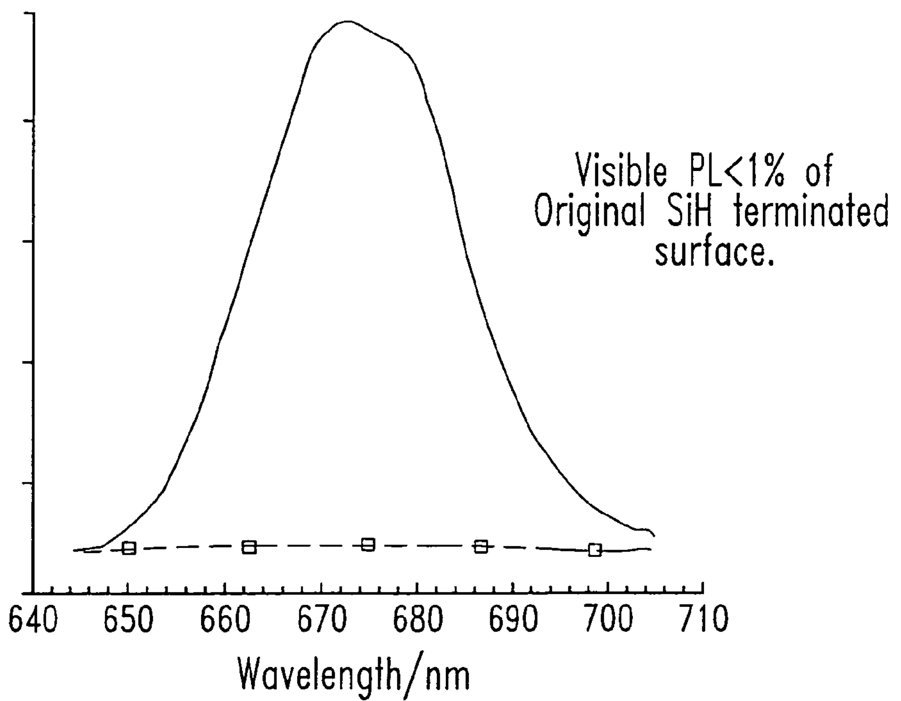
FIG. 21. PL of freshly etched porous silicon (solid line) and phenylacetylene (dotted line) grafted by CEG.
Figure 22:
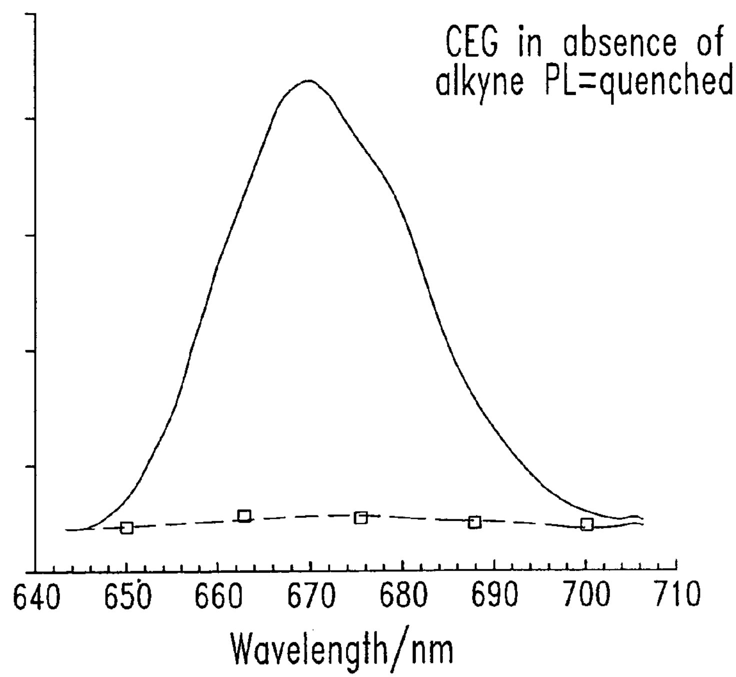
FIG. 22. PL of freshly etched porous silicon (solid line) and CEG in the absence of alkyne (dotted line).
Figure 23:
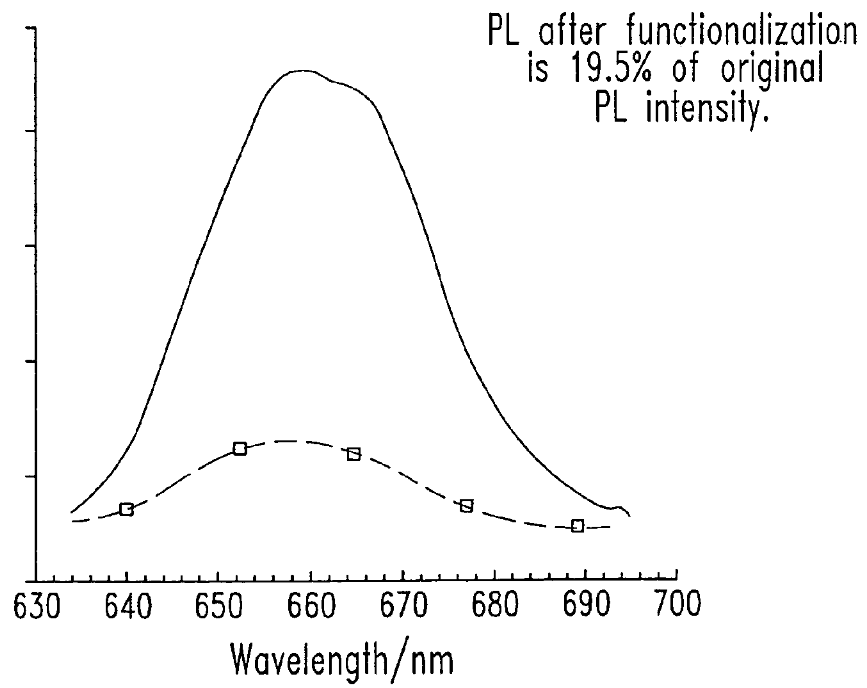
FIG. 23. PL of freshly etched porous silicon (solid line) and 1-dodecyne grafted by AEG (dotted line).

The same general procedures for preparation of porous silicon, electrografting, FT-IR spectra and photoluminescence measurements were followed as set forth in examples 1 and 2. Photoluminescence spectra of CEG samples show varying intensities depending on the surface type (see FIGS. 1 and 13). Upon CEG of 1-dodecyne, 1,7-octadiyne, and 1-pentynyl (see FIGS. 2-3 and 18-20) the surfaces retain between about 5 to 15% of the light emission, with a small red-shift of ~10 nm relative to freshly prepared porous silicon ($\lambda_{max}$=663 nm). The phenethynyl surface (arynyl group) and other highly conjugated alkynyl terminated surfaces (see FIGS. 5-7) show no light emission whatsoever as previously reported. AEG samples have more intense PL, with ~20% remaining for the alkyl protected surface as compared to the etched hydride terminated surface (see FIG. 21).

EXAMPLE 10

CP-AMP Lithography

N-type phosphorus doped silicon (111) wafers (6 in. diameter: 0.0011-0.0015 ohm/cm resistivity: 600-650 μm thickness) were used for all lithography experiments. As for the orientation of the crystal lattice, silicon (111) was chosen for its flatness over other silicon orientations. Near atomically flat surfaces aid in reducing imaging artifacts on the surface.

Lithography was performed under ambient conditions with a Digital Instruments Nanoscope IIIa atomic force microscope in lateral force mode. Lateral force mode was chosen for its ability to measure frictional forces between the probe tip and sample surface. Commercially available platinum coated silicon cantilever-tips were used from Mikro-Mash Inc. (NSC12/pt/50). All imaging was performed in tapping mode AFM using commercially available noncontact mode tips from Mikro-Mash Inc. A galvanostat from EG&G Instruments was used to apply constant current along with an oscilloscope to measure the resulting voltage.

EXAMPLE 11

Dodecyne Line Formation

In the experimental setup for dodecyne, a constant current of 10 nanoamps was used with a corresponding voltage range between 2-4 volts. Dodecyne was distilled and stored under an inert atmosphere until used. A silicon wafer was chemically oxidized in 3:1 (v:v) concentrated $H_2SO_4$: 30% $H_2O_2$ (aq) at 80° C. for 60 minutes. The wafer was then etched in a 5% aqueous solution of hydrofluoric acid for 5 minutes. Lateral force microscopy was then used to write the organic line. The wafer was then optionally washed with dichloromethane, ethanol, pentane, and a rinse of hydrofluoric acid for 10 seconds. If an oxide line were created during the writing process, washing with hydrofluoric acid would remove the oxide and replace it with silicon hydride.

Figure 26:
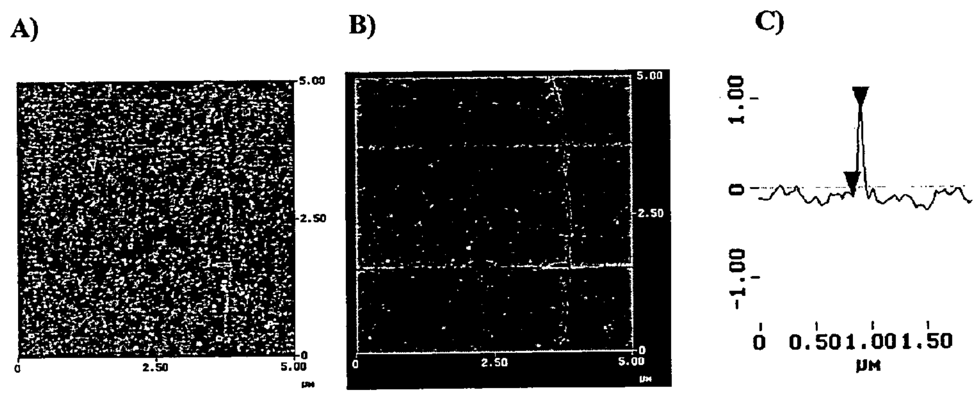
FIG. 26. (a) Tapping mode height image of dodecyne. (b) Tapping mode phase image of dodecyne. (c) Topographical height information of dodecyne.
Figure 27:
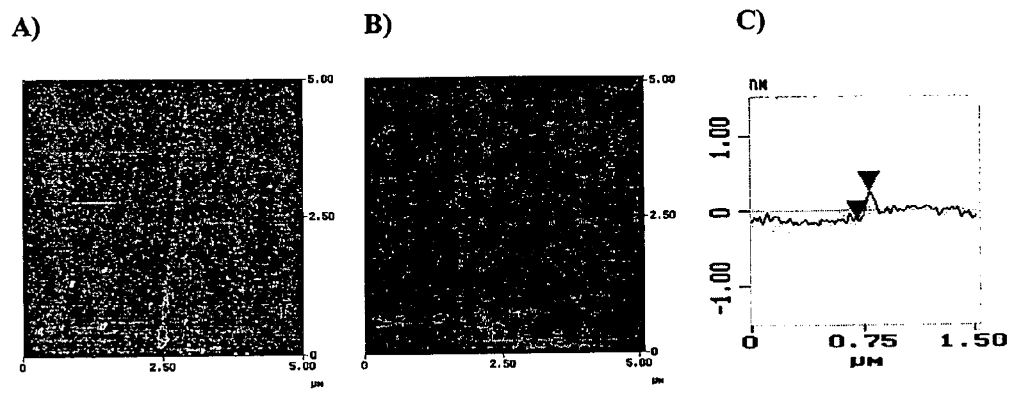
FIG. 27. (a) Tapping mode microscopy height image of 1,4 diethynylbenzene. (b) Phase image of 1,4 diethynylbenzene. (c) Topographical height image of 1,4 diethynylbenzene.

Since a long chained alkyne was use in this case, it is expected that dodecyne forming a covalent bond with silicon would be much "softer" than a silicon hydride bond. In tapping mode, the probe tip measures the topography of the surface with an oscillating tip, and since dodecyne is a long alkyne it is expected that the surface would be quite elastic or "soft" when the tip comes into contact. Thus, a large degree of phase change is expected, which is seen in FIG. 26(*b*). The topographical information for dodecyne gives a height of one nanometer, compared to the calculated theoretical height value of 1.848 nanometers. The reason for the difference in height is due to the tip pushing down on the "soft" alkyne, which distorts the shape to give a smaller actual height value compared to the theoretical calculation.

EXAMPLE 12

1,4 Diethynylbenzene Line Formation

Figure 28:
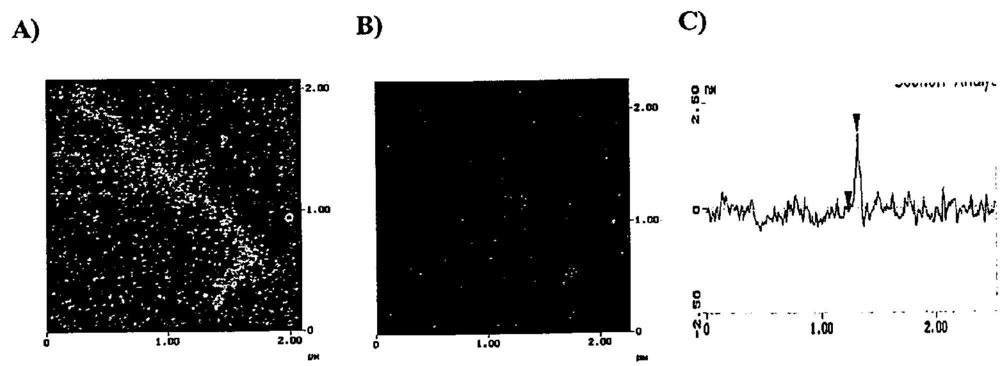
FIG. 28. (a) Tapping mode height image of octadecyne. (b) Phase mode image of octadecyne. (c) Topographical information of octadecyne.

In the experimental setup for 1,4 diethynylbenzene a constant current of 10 nanoamps was used. The corresponding voltage ranged between 2-3 volts. Since diethynylbenzene is a solid at room temperature, a 0.1 M concentration was made with 1,3,5 trimethylbenzene. The solvent was distilled and then stored under inert conditions until use. A silicon wafer was chemically oxidized in 3:1 (v:v) concentrated $H_2SO_4$: 30% $H_2O_2$ (aq) at 80° C. for 60 minutes. The wafer was then etched in a 5% aqueous solution of hydrofluoric acid for 5 minutes. Lateral force microscopy was then used to write the organic line. The wafer was then immediately washed with dichloromethane, ethanol, pentane, and a rinse of a 5% aqueous solution of hydrofluoric acid for 10 seconds. Since 1,4 diethynylbenzene is a hard molecule compared to dodecyne, it is expected that the phase change would be very small, as seen in FIG. 28(*b*). The topographical information gives a projected height of 0.5 nanometers for 1,4 diethynylbenzene. The calculated theoretical height of 1,4 diethynylbenzene is 0.75 nanometers. The theoretical height and the measured height are very similar to each other, providing additional evidence that the line is organic. As discussed above, an oxide line is ruled out due to the hydrofluoric acid wash. While creation of a polymer is possible, if a polymer had been created, the height would be expected to be much taller than it is. 1,3,5 trimethylbenzene was also used alone to eliminate the possibility that it had covalently attached to the surface.

EXAMPLE 13

Octadecyne Line Formation

Figure 29:
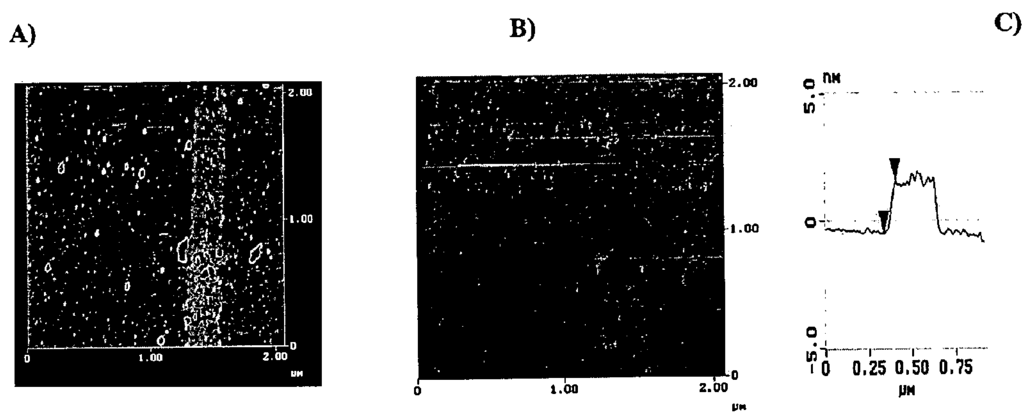
FIG. 29. (a) Tapping mode microcopy image of an oxide line in height mode. (b) Phase image of the oxide line. (c) Topographical information of the height for the oxide line.

For octadecyne a constant current of 10 nanoamps was used with a corresponding voltage range between 3-4 volts. Since octadecyne is a viscous oil at room temperature, the procedure was modified slightly. A drop of octadecyne was placed directly on to the silicon hydride surface and the placed on a spin coater to create a thin layer of octadecyne. The AFM tip was then brought into contact with the organic. The tip was then retracted and the silicon oxide was replaced with silicon hydride. Lateral force microscopy with a scan rate of 2 microns per second was used to write the line. The wafer was then immediately washed with dichloromethane, ethanol, pentane, and a rinse of hydrofluoric acid for 10 seconds. Tapping mode AFM was used to image the height and phase contrast. Since octadecyne has six more carbons than dodecyne, a slightly larger height difference along with a comparable phase is expected In FIG. 28(*c*), the topographical height information gives a height of 2.1 nanometers for octadecyne. The theoretical height calculation for octadecyne gives a value of 2.82 nanometers. FIG. 29(*b*) shows a noticeable phase change. Because a covalently bonded octadecyne would be much softer than the surrounding silicon hydride, this phase change is expected. When the tip comes into contact with octadecyne the tip will push the molecule down slightly distorting the height, which would account for the slight deviation between the actual height measurement and the theoretical calculation. Since the wafer was washed with dichloromethane, ethanol, pentane, and hydrofluoric acid, left over octadecyne or oxide is ruled out. Since a spin coating technique was used to create a thin layer of octadecyne on a silicon hydride surface, an increase in the width of the line is observed.

EXAMPLE 14

Oxide Line Formation

The formation of silicon oxide lines drawn on hydride terminated silicon wafers under a negative tip bias of an atomic force microscope operating in a ambient atmosphere has been studied in great detail. When trying to write organic lines on the surface on silicon hydride under cathodic electrografting conditions there are three possible outcomes, an oxide, polymer, or an alkynyl monolayer. To demonstrate that a covalently bonded alkyne has attached a one molecule thick organic layer on a silicon surface, an oxide line was produced for comparison.

In the standard procedure for lithography of an oxide line, a silicon wafer was chemically oxidized in 3:1 (v:v) concentrated $H_2SO_4$: 30% $H_2O_2$ (aq) at 80° C. for 60 minutes. The wafer was then etched in a 5% aqueous solution of hydrofluoric acid for 5 minutes. A plastic chamber was constructed and placed over the AFM to obtain a humidity range between 40-50%. To create an oxide line, a voltage of greater than 6 volts and a setting of 250 nanoamps is used. Lateral force microscopy was used with a writing speed of 2 microns per second to generate the line. The resulting voltage ranged between 6-10 volts. After writing, the surface was dried with nitrogen to remove the excess water. To image the line, tapping mode AFM was used to produce a height and phase image of the oxide line. Taking into consideration that a phase image shows contrast caused by differences in surface adhesion and due to the expectation that the hardness of an oxide line would not be much different than the surrounding silicon hydride, a very small phase change is expected.

As shown in FIG. 29(*c*), the height of the oxide line is approximately 2.01 nanometers. The shift in the phase of the oxide line from the surrounding hydride terminated surface is approximately 3 degrees. The expected height of the oxide line to be approximately 2 nanometers with the voltage that was used. After the images were taken, the line was rinsed with a 5% aqueous hydrofluoric acid solution for 30 seconds to remove the oxide. An image was taken again of the same region to demonstrate that the oxide line was removed.

Although the invention has been described in detail with reference to certain preferred embodiments, variations and modifications exist within the scope and spirit of the invention as described and defined in the following claims.

The invention claimed is:

1. A method for forming a covalently bound monolayer of organic substituents on a silicon or germanium substrate having a surface comprising silicon or germanium hydride groups, said method comprising the steps of:

contacting the surface of the substrate with a liquid comprising an optionally substituted $C_2$-$C_{24}$ alkyne:

positioning a conductor electrode tip in contact with the liquid disposed on the surface of the substrate;

using the conductor electrode tip to apply an electrical potential sufficient to covalently bind at least a portion of the alkyne to the surface; and moving the tip along the surface to create a pattern of covalently bound alkyne.

2. The method of claim 1 wherein the conductor electrode tip is an atomic force microscope tip.

3. The method of claim 1 wherein the conductor electrode tip is a scanning tunneling microscope tip.

4. The method of claim 1 wherein some portions of the pattern are no more than about 10 molecules thick.

5. The method of claim 1 wherein some portions of the pattern are no more than about 5 molecules thick.

6. The method of claim 1 wherein some portions of the pattern are no more than about 1 moleculethick.

* * * * *

UNITED STATES PATENT AND TRADEMARK OFFICE

CERTIFICATE OF CORRECTION

PATENT NO. : 7,553,776 B2
APPLICATION NO. : 11/499188
DATED : June 30, 2009
INVENTOR(S) : Burial et al.

It is certified that error appears in the above-identified patent and that said Letters Patent is hereby corrected as shown below:

Claim 6: Column 16, line 7, please delete “moleculethick” and insert -- molecule thick -- therefor.

Signed and Sealed this

Twenty-fifth Day of August, 2009

David J. Kappos

David J. Kappos
*Director of the United States Patent and Trademark Office*